United States Patent
Rojals et al.

(10) Patent No.: US 8,976,861 B2
(45) Date of Patent: Mar. 10, 2015

(54) SEPARATELY CODING THE POSITION OF A LAST SIGNIFICANT COEFFICIENT OF A VIDEO BLOCK IN VIDEO CODING

(75) Inventors: Joel Sole Rojals, La Jolla, CA (US); Rajan Laxman Joshi, San Diego, CA (US); Marta Karczewicz, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 751 days.

(21) Appl. No.: 13/302,996

(22) Filed: Nov. 22, 2011

(65) Prior Publication Data

US 2012/0140813 A1    Jun. 7, 2012

Related U.S. Application Data

(60) Provisional application No. 61/419,740, filed on Dec. 3, 2010.

(51) Int. Cl.
*H04B 1/66* (2006.01)
*H04N 7/12* (2006.01)
(Continued)

(52) U.S. Cl.
CPC ....... *H04N 19/00157* (2013.01); *H03M 7/4018* (2013.01); *H03M 7/4075* (2013.01); *H03M 7/6035* (2013.01); *H04N 19/00296* (2013.01);
(Continued)

(58) Field of Classification Search
None
See application file for complete search history.

(56) References Cited

U.S. PATENT DOCUMENTS 1,679,903 A    8/1928  Holinger
5,295,203 A    3/1994  Krause et al.
(Continued)

FOREIGN PATENT DOCUMENTS

EP    1041826 A1    10/2000
EP    1768415 A1    3/2007
(Continued)

OTHER PUBLICATIONS

Marpe et al.: "Context-Based Adaptive Binary Arithmetic Coding in the H.264/AVC Video Compression Standard," IEEE Trans, Circuits System Video Technology, vol. 13, pp. 620-636, Jul. 2003.
(Continued)

*Primary Examiner* — Joseph Ustaris
*Assistant Examiner* — Ellyar Y Barazesh
(74) *Attorney, Agent, or Firm* — Shumaker & Sieffert, P.A.

(57) ABSTRACT

In one example, an apparatus is disclosed for coding coefficients associated with a block of video data during a video coding process, wherein the apparatus includes a video coder configured to code information that identifies a position of a last non-zero coefficient within the block according to a scanning order associated with the block prior to coding information that identifies positions of other non-zero coefficients within the block, including at least one of the following: coding a one-dimensional position within the block that identifies the position of the last non-zero coefficient; coding a two-dimensional position within the block that identifies the position of the last non-zero coefficient, and coding a flag that indicates whether the last non-zero coefficient is located within a range of positions within the block, and coding the one-dimensional position when the last non-zero coefficient is located within the range, and otherwise coding the two-dimensional position.

85 Claims, 9 Drawing Sheets

(51) Int. Cl.
| | | |
|---|---|---|
| *H04N 11/02* | (2006.01) | |
| *H04N 11/04* | (2006.01) | |
| *G06K 9/46* | (2006.01) | |
| *H04N 19/14* | (2014.01) | |
| *H03M 7/40* | (2006.01) | |
| *H03M 7/30* | (2006.01) | |
| *H04N 19/18* | (2014.01) | |
| *H04N 19/70* | (2014.01) | |
| *H04N 19/129* | (2014.01) | |
| *H04N 19/176* | (2014.01) | |
| *H04N 19/61* | (2014.01) | |
| *H04N 19/436* | (2014.01) | |
| *H04N 19/13* | (2014.01) | |

(52) U.S. Cl.
CPC ... *H04N 19/00884* (2013.01); *H04N 19/00109* (2013.01); *H04N 19/00278* (2013.01); *H04N 19/00781* (2013.01); *H04N 19/00521* (2013.01); *H04N 19/00121* (2013.01)
USPC ............ 375/240.02; 375/240.16; 375/240.18; 382/247

(56) References Cited

U.S. PATENT DOCUMENTS

| | | | |
|---|---|---|---|
| 5,583,657 A | 12/1996 | Jeong | |
| 5,631,744 A | 5/1997 | Takeuchi et al. | |
| 5,818,877 A | 10/1998 | Tsai et al. | |
| 5,838,825 A | 11/1998 | Obayashi et al. | |
| 5,852,469 A | 12/1998 | Nagai et al. | |
| 6,301,304 B1 | 10/2001 | Jing et al. | |
| 6,646,578 B1 | 11/2003 | Au | |
| 6,680,974 B1 | 1/2004 | Faryar et al. | |
| 6,856,701 B2 | 2/2005 | Karczewicz et al. | |
| 7,369,066 B1 | 5/2008 | Benzreba et al. | |
| 7,376,280 B2 | 5/2008 | Handley et al. | |
| 7,379,608 B2 | 5/2008 | Marpe et al. | |
| 7,483,575 B2 | 1/2009 | Fukuhara et al. | |
| 7,522,774 B2 | 4/2009 | Ramasastry et al. | |
| 7,535,387 B1 | 5/2009 | Delva | |
| 7,609,904 B2 | 10/2009 | Miller | |
| 7,702,013 B2 | 4/2010 | Schwarz et al. | |
| 7,813,567 B2 | 10/2010 | Sankaran | |
| 7,843,998 B2 | 11/2010 | Bjøntegaard | |
| 7,885,473 B2 | 2/2011 | Sankaran | |
| 7,920,629 B2 | 4/2011 | Bjontegaard et al. | |
| 8,311,119 B2 | 11/2012 | Srinivasan | |
| 2003/0016876 A1 | 1/2003 | Chai et al. | |
| 2003/0048208 A1 | 3/2003 | Karczewicz | |
| 2003/0081850 A1* | 5/2003 | Karczewicz et al. | 382/247 |
| 2003/0128886 A1 | 7/2003 | Said | |
| 2004/0184544 A1 | 9/2004 | Kondo et al. | |
| 2005/0036549 A1 | 2/2005 | He et al. | |
| 2005/0123207 A1 | 6/2005 | Marpe et al. | |
| 2006/0078049 A1 | 4/2006 | Bao et al. | |
| 2006/0227865 A1 | 10/2006 | Sherigar | |
| 2007/0036223 A1* | 2/2007 | Srinivasan | 375/240.18 |
| 2007/0071331 A1 | 3/2007 | Liu | |
| 2007/0285285 A1 | 12/2007 | Puri et al. | |
| 2008/0013633 A1 | 1/2008 | Ye et al. | |
| 2008/0089425 A1 | 4/2008 | Karczewicz | |
| 2008/0152015 A1 | 6/2008 | Benzreba et al. | |
| 2008/0219578 A1* | 9/2008 | Lee | 382/247 |
| 2008/0310504 A1 | 12/2008 | Ye et al. | |
| 2008/0310507 A1 | 12/2008 | Ye et al. | |
| 2008/0310745 A1 | 12/2008 | Ye et al. | |
| 2009/0154820 A1 | 6/2009 | Li et al. | |
| 2009/0175332 A1* | 7/2009 | Karczewicz et al. | 375/240.03 |
| 2009/0202158 A1 | 8/2009 | Hwang et al. | |
| 2009/0232204 A1* | 9/2009 | Lee et al. | 375/240.02 |
| 2009/0273706 A1 | 11/2009 | Tu et al. | |
| 2010/0020867 A1* | 1/2010 | Wiegand et al. | 375/240.02 |
| 2010/0097248 A1 | 4/2010 | Sze et al. | |
| 2010/0111432 A1 | 5/2010 | Mohr | |
| 2010/0118571 A1 | 5/2010 | Tanida et al. | |
| 2010/0141489 A1 | 6/2010 | Reznik | |
| 2010/0150226 A1 | 6/2010 | Hallapuro et al. | |
| 2010/0324912 A1 | 12/2010 | Choo et al. | |
| 2011/0001643 A1 | 1/2011 | Sze et al. | |
| 2011/0080956 A1 | 4/2011 | Zhou et al. | |
| 2011/0090955 A1 | 4/2011 | Liu et al. | |
| 2011/0096834 A1 | 4/2011 | Cheon et al. | |
| 2011/0097003 A1 | 4/2011 | Alshina et al. | |
| 2011/0103489 A1 | 5/2011 | Takada | |
| 2011/0206135 A1 | 8/2011 | Drugeon et al. | |
| 2011/0206289 A1 | 8/2011 | Dikbas et al. | |
| 2011/0243220 A1 | 10/2011 | Seregin et al. | |
| 2011/0249755 A1 | 10/2011 | Shibahara et al. | |
| 2011/0255799 A1 | 10/2011 | Omori | |
| 2011/0268183 A1 | 11/2011 | Sole et al. | |
| 2012/0008683 A1 | 1/2012 | Karczewicz et al. | |
| 2012/0082233 A1 | 4/2012 | Sze et al. | |
| 2012/0163469 A1 | 6/2012 | Kim et al. | |
| 2012/0236929 A1 | 9/2012 | Liu | |
| 2012/0262313 A1 | 10/2012 | He et al. | |
| 2012/0269263 A1 | 10/2012 | Bordes et al. | |
| 2012/0288003 A1 | 11/2012 | Do et al. | |
| 2013/0003834 A1 | 1/2013 | Rojals et al. | |
| 2013/0003835 A1 | 1/2013 | Sole et al. | |
| 2013/0051472 A1 | 2/2013 | Wiegand et al. | |
| 2013/0058407 A1 | 3/2013 | Sole et al. | |
| 2013/0114731 A1* | 5/2013 | Lee et al. | 375/240.18 |

FOREIGN PATENT DOCUMENTS

| | | |
|---|---|---|
| EP | 2182732 A1 | 5/2010 |
| JP | 2003224851 A | 8/2003 |
| JP | 2006211304 A | 8/2006 |
| WO | 2007043583 A1 | 4/2007 |
| WO | WO2007063472 A2 | 6/2007 |
| WO | WO2009075445 A1 | 6/2009 |
| WO | 2009134575 A2 | 11/2009 |
| WO | 2010018138 A1 | 2/2010 |
| WO | WO2010131546 A1 | 11/2010 |
| WO | 2011128303 A2 | 10/2011 |

OTHER PUBLICATIONS

Winken et al., "Video coding technology proposal by Fraunhofer HHI", 1. JCT-VC Meeting; Apr. 15, 2010-Apr. 23, 2010; Dresden; (Jointcollaborative Team on Video Coding of ISO/IEC JTC1/SC29/WG11 and ITU-TSG. 16) ; URL: http://WFTP3.ITU. INT/AV-ARCH/JCTVC-SITE/, No. XP030007556, Apr. 24, 2010, XP030007557.

McCann et al., "Samsung's Response to the Call for Proposals on Video Compression Technology," Joint Collaborative Team on Video Coding (JCT-VC) of ITU-T SG-16 WP3 and ISO/IEC JTC1/SC29/WG11, 1st meeting, Document: JCTVC-A124, Dresden, DE, Apr. 15-23, 2010, 42 pp.

Misra et al., "A memory efficient method for fast transposing run-length encoded images", This paper appears in: Proceedings of the Fifth International Conference on Document Analysis and Recognition, 1999. ICDAR '99, Sep. 20-22, 1999.

Kim et al., "Efficient entropy coding scheme for H.264/AVC lossless video coding," Elsevier, Image Communication, Apr. 24, 2010, 10 pp.

Davies, "BBC's Response to the Call for Proposals on Video Compression Technologies," JCTVC-A125, 1$^{st}$ meeting: Dresden, DE, Apr. 15-23, 2010, 30 pp.

ITU-T H.264, "Series H: Audiovisual and Multimedia Systems, Infrastructure of audiovisual services—Coding of moving video, Advanced video coding for generic audiovisual services," Mar. 2010, 669 pp.

Wiegand et al., "WD3: Working Draft 3 of High-Efficiency Video Coding," Document JCTVC-E603, 5th Meeting: Geneva, CH, Mar. 16-23, 2011, 193 pp.

U.S. Appl. No. 13/332,300, by Joel Sole Rojals, filed Dec. 20, 2011.
U.S. Appl. No. 13/303,015, by Joel Sole Rojals, filed Nov. 22, 2011.

(56) References Cited

OTHER PUBLICATIONS

U.S. Appl. No. 13/332,054, by Muhammed Zeyd Coban, filed Dec. 20, 2011.
Budagavi et al., "TE8: TI Parallel context processing (PCP) proposal," JCTVC-0062, Oct. 7-15, 2010, 7 pp.
Office Action from counterpart Japanese Application No. 2013-542146, dated Jun. 24, 2014, 31 pp.
Anonymous, "Test Model under Consideration," Joint Collaborative Team on Video Coding, Document: JCTVC-B205, Jul. 21-28, 2010, p. 150, paragraph 13.2.5—p. 151, paragraph 13.2.6.
Davies, T. et al., "Suggestion for a Test Model," Joint Collaborative Team on Video Coding, May 7, 2010, 30 pp.
International Search Report and Written Opinion of international application No. PCT/US2011/062700, dated Feb. 13, 2012, 19 pp.
Lee, J. et al., "An Efficient Encoding of DCT Blocks with Block-Adaptive Scanning," IEICE Transactions of Communications, vol. E77-B, No. 12, Dec. 1994, 6 pp.
Schaar-Mitreo, M. et al., "Novel Embedded Compression Algorithm for Memory Reduction in MPEG Codecs," SPIE Conference on Visual Communications, vol. 3653, Dec. 28, 1998, 10 pp.
Min, J. et al., "Adaptive significance map coding for large transform", Joint Collaborative Team on Video Coding, Document: JCTVC-F598, Jul. 14-22, 2011, 3 pp.
Seregin, V. et al., "Low-complexity adaptive coefficients scanning," Joint Collaborative Team on Video Coding, Document: JCTVC-C205, Oct. 7-15, 2010, 4 pp.
Sole Rojals, J. et al., "Parallel Context Processing for the significance map in high coding efficiency," Joint Collaborative Team on Video Coding, Document: JCTVC-D262, Jan. 16, 2011, 4 pp.
Sole Rojals, J. et al. "Parallel Context Processing for the significance map in high coding efficiency," Joint Collaborative Team on Video Coding, JCTVC-D262 PowerPoint, Jan. 20-28, 2011, 8 pp.
Winken, M. et al., "Video Coding Technology Proposal by Fraunhofer Hhi," Joint Collaborative Team on Video Coding, JCTVC-A116 PowerPoint, Apr. 24, 2010, 28 pp.
Yu, W. et al., "Probability Modeling for Encoding Quantized Transform Coefficients," IEEE Picture Coding Symposium, Apr. 24, 2006, 6 pp.
Bjontegaard et al., "Context-Adaptive VLC (CVLC) Coding of Coefficients," Document JVT-C028, 3rd Meeting: Fairfax, Virginia, USA, May 6-10, 2002, 8 pp.
Wiegand et al., "WD1: Working Draft 1 of High-Efficiency Video Coding", JCTVC-C403, 3rd Meeting: Guangzhou, CN, Oct. 7-15, 2010, 137 pp.
Wiegand et al., "WD2: Working Draft 2 of High-Efficiency Video Coding," JCTVC-D503, 4th Meeting: Daegu, KR, Jan. 20-28, 2011, 153 pp.
Budagavi et al.,"Parallel Context Processing techniques for high coding efficiency entropy coding in HEVC," Document JCTVC-B088, 2nd Meeting: Geneva, CH, Jul. 21-28, 2010, 11 pp.
ITU-T H.264, Series H: Audiovisual and Multimedia Systems, Infrastructure of audiovisual services—Coding of moving video, Advanced video coding for generic audiovisual services, The International Telecommunication Union. Jun. 2011, 674 pp.
Davies, "Unified scan processing for high efficiency coefficient coding," Document JCTVC-D219, 4th Meeting: Daegu, KR, Jan. 20-28, 201, 7 pp.
Joshi et al., "CE7: Mode dependent intra residual coding," Document JCTVC-E098, 5th Meeting: Geneva, CH, Mar. 16-23, 2011, 9 pp.
Marpe et al., "Unified PIPE-Based Entropy Coding for HEVC," Document JCTVC-F268, 6th Meeting: Torino, IT, Jul. 14-22, 2011, 16 pp.
Nguyen et al: "Improved Context Modeling for Coding Quantized Transform Coefficients in Video Compression," Dec. 8-10, 2010, 28th Picture Coding Symposium, Nagoya, Japan, 4 pp.
Nguyen et al., "Context Set Selection for Coefficient Level Coding," Document JCTVC-H0404, 8th Meeting: San Jose, CA, USA, Feb. 1-10, 2012, 8 pp.
Nguyen et al., "Reduced-complexity entropy coding of transform coefficient levels using a combination of VLC and Pipe," Document JCTVC-D336, 4th Meeting: Daegu, KR, Jan. 20-28, 2011, 9 pp.
Sole et al., "CE11: Parallel Context Processing for the significance map in high coding efficiency," Document JCTVC-E338, 5th Meeting: Geneva, CH, Mar. 16-23, 2011, 5 pp.
Sole et al., "CE11: Removal of the parsing dependency of residual coding on intra mode," Document JCVTC-G321, 7th Meeting: Geneva, CH, Nov. 21-30, 2011, 6 pp.
Sole et al., "Parallel Context Processing for the significance map in high coding efficiency," Document JCTVC-D262, WG11 No. m19026, 4th Meeting: Daegu, KR, Jan. 20-28, 2011, 4 pp.
Sole et al., "Parallel processing of residual data in HE," Document JCTVC-F552, 6th Meeting: Torino, IT, Jul. 14-22, 2011, 3 pp.
Sole et al., "Removal of the parsing dependency of residual coding on intra mode," Document JCTVC-F550, 6th Meeting: Torino, IT, Jul. 14-22, 2011, 3 pp.
Sole et al., "CE11: Unified scans for the significance map and coefficient level coding in high efficiency," Document JCTVC-F288, 6th Meeting: Torino, IT, Jul. 14-22, 2011, 9 pp.
Sole et al., "Unified scans for the significance map and coefficient level coding in high coding efficiency," Document JCTVC-E335, 5th Meeting: Geneva, CH, Mar. 15-23, 2011, 5 pp.
Sole et al., "CE11: Scanning Passes of Residual Data in HE," Document JCTVC-G320, 7th Meeting: Geneva, CH, Nov. 21-30, 3 pp.
Sze, "CE11: Coding efficiency of tools in HHI Transform_Coding (JCTVC-A116)," Document JCTVC-D190, WG11: m18949, 4th Meeting: Daegu, KR, Jan. 20-28, 2011, 8 pp.
Sze et al., "Parallel Context Processing of Coefficient Level," Document JCTVC-F130, WG11 No. m20547, 6th Meeting: Torino, IT, Jul. 14-22, 2011, 4 pp.
Bross et al., "WD4: Working Draft 4 of High-Efficiency Video Coding," 6th Meeting: JCTVC-F803_d2, Torino, IT, Jul. 14-22, 2011, 226 pp.
Bross et al., "WD5: Working Draft 5 of High-Efficiency Video Coding," 7th Meeting: Geneva, Switzerland, Nov. 21-30, 2011, JCTVC-G1103_d2, 214 pp.
Zhang et al., "Context-Based Entropy Coding in AVS Video Coding Standard," Signal Processing: Image Communication 24 (2009): 263-276.
Zhang et al., "Non-CE1: On CABAC parsing throughput," Document JCTVC-H0533, 8th Meeting: San Jose, CA, USA, Feb. 1-10, 2012, 7 pp.
Second Written Opinion of international application No. PCT/US2011/062700, dated Nov. 27, 2012, 14 pp.
International Preliminary Report on Patentability from international application No. PCT/US2011/062700, dated Aug. 3, 2013, 53 pp.
Seregin et al., "Low-complexity adaptive coefficients scanning", Joint Collaborative Team on Video Coding (JCT-VC).
U.S. Appl. No. 13/413,472, by Joel Sole Rojals, filed Mar. 6, 2012.
U.S. Appl. No. 13/413,497, by Joel Sole Rojals, filed Mar. 6, 2012.
U.S. Appl. No. 13/413,514, by Joel Sole Rojals, filed on Mar. 6, 2012.
U.S. Appl. No. 13/413,526, by Joel Sole Rojals, filed Mar. 6, 2012.
Ye, Y. et al., "Improved intra coding," International Telecommunications Union-Telecommunications Standardization Sector, Document VCEG-AG11, Oct. 20, 2007, 6 pp.
Choi, B.D. et al., "Adaptive Coefficient Scanning Based on the Intra Prediction Mode," ETRI Journal, vol. 29, No. 5, Oct. 2007, 3 pp.
Jie J., et al., "A most probable scan mode decision for H.264/AVC inter picture coding," IEEE International Conference on Computer Science and Information Technology, Aug. 2009, 5 pp.
Puri, A. et al., "Improvements in DCT Based Video Coding," Proceedings of SPIE, vol. 3024, Feb. 12, 1997, 13 pp.
Shim, S.Y. et al., Adaptive Scanning Patterns for Intra Prediction International Telecommunications Union- Telecommunications Standardization Sector, Document VCEG-AH14, Jan. 12-13, 2008, 8 pp.

* cited by examiner

| 6 | 2 | 406<br>1 | 0 |
|---|---|---|---|
| 3 | 3 | 0 | 0 |
| 1 | 0 | 0 | 0 |
| 0 | 0 | 0 | 0 |

| 1 | 1 | 408<br>1 | 0 |
|---|---|---|---|
| 1 | 1 | 0 | 0 |
| 1 | 0 | 0 | 0 |
| 0 | 0 | 0 | 0 |

| 0 | 0 | 410<br>1 | 0 |
|---|---|---|---|
| 0 | 0 | 0 | 0 |
| 0 | 0 | 0 | 0 |
| 0 | 0 | 0 | 0 |

FIG. 4C

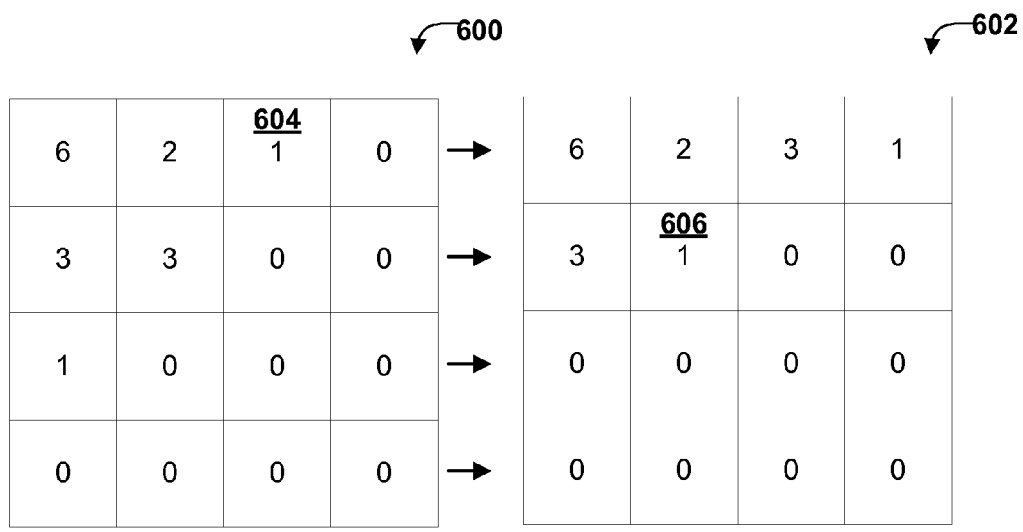
FIG. 6A  FIG. 6B

SEPARATELY CODING THE POSITION OF A LAST SIGNIFICANT COEFFICIENT OF A VIDEO BLOCK IN VIDEO CODING

This application claims the benefit of U.S. Provisional Application No. 61/419,740, filed Dec. 3, 2010, which is incorporated herein by reference in its entirety.

TECHNICAL FIELD

This disclosure relates to video coding, and more particularly, to the coding of syntax information related to coefficients of a video block.

BACKGROUND

Digital video capabilities can be incorporated into a wide range of devices, including digital televisions, digital direct broadcast systems, wireless broadcast systems, personal digital assistants (PDAs), laptop or desktop computers, tablet computers, e-book readers, digital cameras, digital recording devices, digital media players, video gaming devices, video game consoles, cellular or satellite radio telephones, so-called "smart phones," video teleconferencing devices, video streaming devices, and the like. Digital video devices implement video compression techniques, such as those described in the standards defined by MPEG-2, MPEG-4, ITU-T H.263, ITU-T H.264/MPEG-4, Part 10, Advanced Video Coding (AVC), the High Efficiency Video Coding (HEVC) standard presently under development, and extensions of such standards. The video devices may transmit, receive, encode, decode, and/or store digital video information more efficiently by implementing such video compression techniques.

Video compression techniques perform spatial (intra-picture) prediction and/or temporal (inter-picture) prediction to reduce or remove redundancy inherent in video sequences. For block-based video coding, a video slice (i.e., a video frame or a portion of a video frame) may be partitioned into video blocks, which may also be referred to as treeblocks, coding units (CUs) and/or coding nodes. Video blocks in an intra-coded (I) slice of a picture are encoded using spatial prediction with respect to reference samples in neighboring blocks in the same picture. Video blocks in an inter-coded (P or B) slice of a picture may use spatial prediction with respect to reference samples in neighboring blocks in the same picture or temporal prediction with respect to reference samples in other reference pictures. Pictures may be referred to as frames, and reference pictures may be referred to as reference frames.

Spatial or temporal prediction results in a predictive block for a block to be coded. Residual data represents pixel differences between the original block to be coded and the predictive block. An inter-coded block is encoded according to a motion vector that points to a block of reference samples forming the predictive block, and the residual data indicating the difference between the coded block and the predictive block. An intra-coded block is encoded according to an intra-coding mode and the residual data. For further compression, the residual data may be transformed from the pixel domain to a transform domain, resulting in residual transform coefficients, which then may be quantized. The quantized transform coefficients, initially arranged in a two-dimensional array, may be scanned in order to produce a one-dimensional vector of transform coefficients, and entropy coding may be applied to achieve even more compression.

SUMMARY

This disclosure describes techniques for coding coefficients associated with a block of video data during a video coding process. The techniques include coding information that identifies a position of a last non-zero, or "significant" coefficient within the block according to a scanning order associated with the block, i.e., last significant coefficient position information for the block, prior to coding information that identifies positions of other significant coefficients within the block, i.e., significant coefficient position information for the block. The techniques further include coding the last significant coefficient position information for the block by performing at least one of the following: coding a one-dimensional position within the block that identifies the position of the last significant coefficient within the block according to the scanning order; coding a two-dimensional position within the block that identifies the position of the last significant coefficient within the block according to the scanning order; and coding a flag that indicates whether the last significant coefficient within the block according to the scanning order is located within a range of positions within the block, and coding the one-dimensional position within the block when the last significant coefficient within the block according to the scanning order is located within the range, and otherwise coding the two-dimensional position within the block.

The techniques of this disclosure may allow coding systems to have lower complexity relative to other systems, and may allow for more efficient coding methods relative to other methods, when coding the last significant coefficient position information for the block and the significant coefficient position information for the block. Coding the last significant coefficient position information prior to coding the significant coefficient position information has the effect of separating these coding steps, which may enable coding the information in parallel, and may enable using coding systems that have lower complexity relative to other systems, e.g., systems that code the information in an interleaved manner.

Additionally, availability of the last significant coefficient position information prior to coding the significant coefficient position information may enable using the last significant coefficient position information to code the information itself and other information for the block. In some examples, the last significant coefficient position information may be used as a context for coding the information itself, and for coding the significant coefficient position information, for example, when performing a context adaptive entropy coding process (e.g., a context adaptive binary arithmetic coding (CABAC) process) that includes applying a context model based on the context. Using the last significant coefficient position information in this manner may result in using accurate statistics to code the information itself, and to code the significant coefficient position information, which may enable coding the information more efficiently, e.g., using a smaller number of bits, than when using other methods.

In other examples, the last significant coefficient position information may be used as syntax information for coding the information itself, and for coding the significant coefficient position information, which may once again enable using coding systems that have lower complexity relative to other systems, and more efficient coding methods relative to other methods.

As one example, the last significant coefficient position information may be used to determine how the information itself is to be coded, e.g., using different techniques to code the information depending on the position of the last significant coefficient within the block according to the scanning order, which may enable coding the information more efficiently than when using other methods.

As another example, the last significant coefficient position information may be used to determine a context for coding the significant coefficient position information, for example, when performing a context adaptive entropy coding process (e.g., a CABAC process) that includes applying a context model based on the context. For example, the significance of the coefficients located before the last significant coefficient within the block according to the scanning order may be coded in a reversed scanning order, starting from the last significant coefficient, and proceeding to the first coefficient in the scanning order. In this example, the significance of each coefficient may be coded by using the significance of previously coded coefficients as a context, which may result in using accurate statistics to code the significant coefficient position information, and enable coding the information more efficiently than when using other methods.

As still another example, the last significant coefficient position information may be used to jointly code the significant coefficient position information. For example, the significant coefficient position information may be coded by arranging multiple coefficients located before the last significant coefficient within the block according to the scanning order into one or more groups, and jointly coding the significance of the coefficients within each group. Using the last significant coefficient position information in this manner may enable coding the significant coefficient position information itself in parallel, which may once again enable using coding systems that have lower complexity than other systems, and coding the information more efficiently than when using other methods.

The techniques of this disclosure may be used with any context adaptive entropy coding methodology, including CABAC, probability interval partitioning entropy coding (PIPE), or another context adaptive entropy coding methodology. CABAC is described in this disclosure for purposes of illustration, but without limitation as to the techniques broadly described in this disclosure. Also, the techniques may be applied to coding of other types of data generally, e.g., in addition to video data.

Accordingly, the techniques of this disclosure may enable using coding systems that have lower complexity relative to other systems, and more efficient coding methods relative to other methods, when coding the last significant coefficient position information for the block and the significant coefficient position information for the block. In this manner, there may be a relative bit savings for a coded bitstream including the information, and a relative reduction in complexity for a system used to code the information, when using the techniques of this disclosure.

In one example, a method of coding coefficients associated with a block of video data during a video coding process includes coding information that identifies a position of a last non-zero coefficient within the block according to a scanning order associated with the block prior to coding information that identifies positions of other non-zero coefficients within the block, wherein coding the information that identifies the position of the last non-zero coefficient within the block according to the scanning order includes at least one of the following: coding a one-dimensional position within the block that identifies the position of the last non-zero coefficient within the block according to the scanning order; coding a two-dimensional position within the block that identifies the position of the last non-zero coefficient within the block according to the scanning order; and coding a flag that indicates whether the last non-zero coefficient within the block according to the scanning order is located within a range of positions within the block, and coding the one-dimensional position within the block when the last non-zero coefficient within the block according to the scanning order is located within the range, and otherwise coding the two-dimensional position within the block.

In another example, an apparatus for coding coefficients associated with a block of video data during a video coding process includes a video coder configured to code information that identifies a position of a last non-zero coefficient within the block according to a scanning order associated with the block prior to coding information that identifies positions of other non-zero coefficients within the block, wherein to code the information that identifies the position of the last non-zero coefficient within the block according to the scanning order, the video coder is configured to perform at least one of the following: code a one-dimensional position within the block that identifies the position of the last non-zero coefficient within the block according to the scanning order; code a two-dimensional position within the block that identifies the position of the last non-zero coefficient within the block according to the scanning order; and code a flag that indicates whether the last non-zero coefficient within the block according to the scanning order is located within a range of positions within the block, and code the one-dimensional position within the block when the last non-zero coefficient within the block according to the scanning order is located within the range, and otherwise code the two-dimensional position within the block.

In another example, a device for coding coefficients associated with a block of video data during a video coding process includes means for coding information that identifies a position of a last non-zero coefficient within the block according to a scanning order associated with the block prior to coding information that identifies positions of other non-zero coefficients within the block, wherein the means for coding the information that identifies the position of the last non-zero coefficient within the block according to the scanning order includes at least one of the following: means for coding a one-dimensional position within the block that identifies the position of the last non-zero coefficient within the block according to the scanning order; means for coding a two-dimensional position within the block that identifies the position of the last non-zero coefficient within the block according to the scanning order; and means for coding a flag that indicates whether the last non-zero coefficient within the block according to the scanning order is located within a range of positions within the block, and coding the one-dimensional position within the block when the last non-zero coefficient within the block according to the scanning order is located within the range, and otherwise coding the two-dimensional position within the block.

The techniques described in this disclosure may be implemented in hardware, software, firmware, or combinations thereof. If implemented in hardware, an apparatus may be realized as an integrated circuit, a processor, discrete logic, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a tangible computer-readable medium and loaded and executed in the processor.

Accordingly, this disclosure also contemplates a computer-readable medium comprising instructions that, when executed, cause a processor to code information that identifies a position of a last non-zero coefficient within the block according to a scanning order associated with the block prior to coding information that identifies positions of other non-zero coefficients within the block, wherein the instructions that cause the processor to code the information that identifies the position of the last non-zero coefficient within the block according to the scanning order include instructions that cause the processor to perform at least one of the following: code a one-dimensional position within the block that identifies the position of the last non-zero coefficient within the block according to the scanning order; code a two-dimensional position within the block that identifies the position of the last non-zero coefficient within the block according to the scanning order; and code a flag that indicates whether the last non-zero coefficient within the block according to the scanning order is located within a range of positions within the block, and code the one-dimensional position within the block when the last non-zero coefficient within the block according to the scanning order is located within the range, and otherwise code the two-dimensional position within the block.

The details of one or more examples are set forth in the accompanying drawings and the description below. Other features, objects, and advantages will be apparent from the description and drawings, and from the claims.

BRIEF DESCRIPTION OF DRAWINGS

FIGS. 4A-4C are conceptual diagrams that illustrate an example of a block of video data and corresponding significant coefficient position information and last significant coefficient position information.

FIGS. 6A-6B are conceptual diagrams that illustrate examples of last significant coefficient position information for blocks of video data.

DETAILED DESCRIPTION

Figure 1:
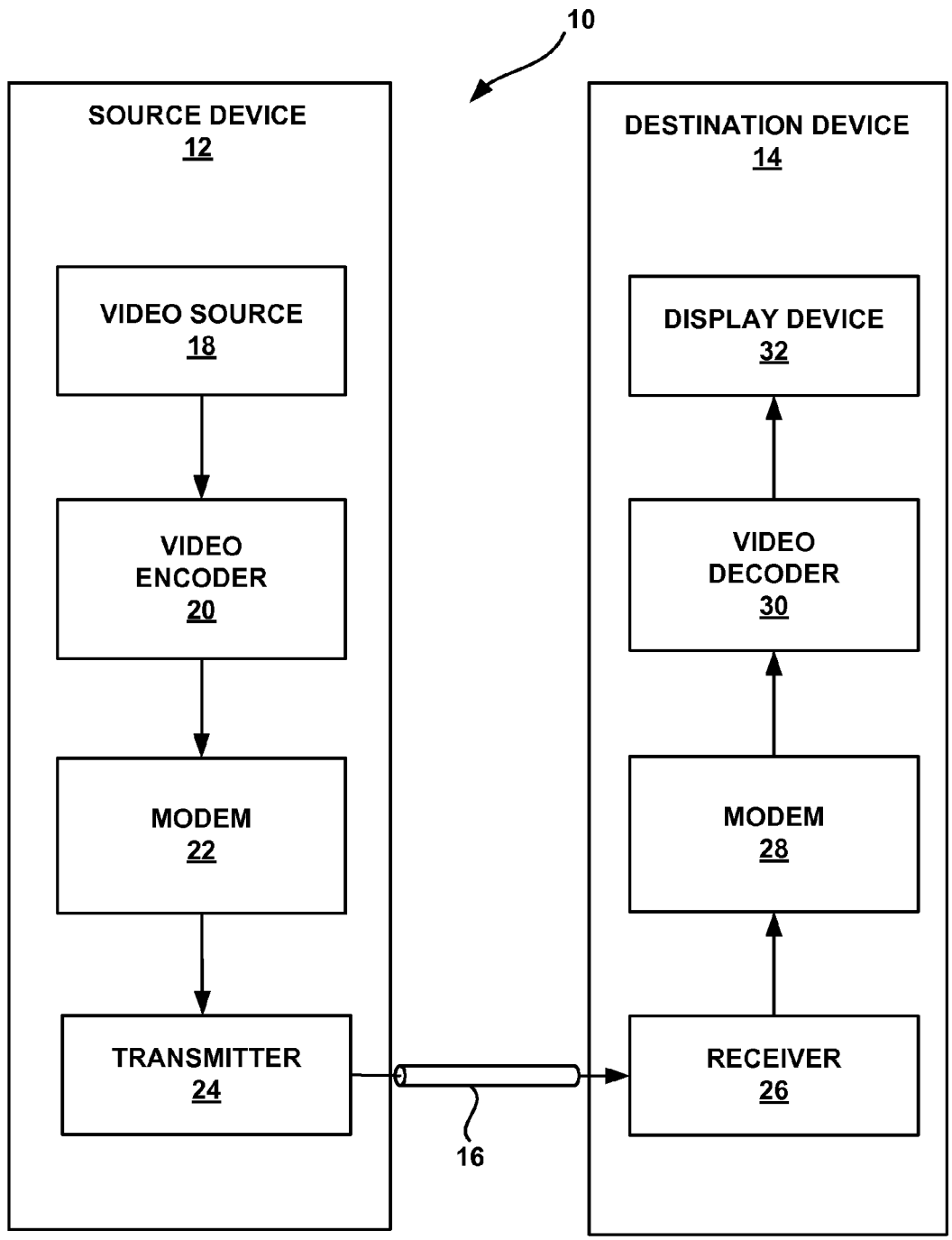
FIG. 1 is a block diagram that illustrates an example of a video encoding and decoding system that may implement techniques for coding last significant coefficient position information for a block of video data prior to coding significant coefficient position information for the block, consistent with the techniques of this disclosure.

This disclosure describes techniques for coding coefficients associated with a block of video data during a video coding process. The techniques include coding information that identifies a position of a last non-zero, or "significant" coefficient within the block according to a scanning order associated with the block, i.e., last significant coefficient position information for the block, prior to coding information that identifies positions of other significant coefficients within the block, i.e., significant coefficient position information for the block. The techniques further include coding the last significant coefficient position information for the block by performing at least one of the following: coding a one-dimensional position within the block that identifies the position of the last significant coefficient within the block according to the scanning order; coding a two-dimensional position within the block that identifies the position of the last significant coefficient within the block according to the scanning order; and coding a flag that indicates whether the last significant coefficient within the block according to the scanning order is located within a range of positions within the block, and coding the one-dimensional position within the block when the last significant coefficient within the block according to the scanning order is located within the range, and otherwise coding the two-dimensional position within the block.

The techniques of this disclosure may allow coding systems to have lower complexity relative to other systems, and may allow for more efficient coding methods relative to other methods, when coding the last significant coefficient position information for the block and the significant coefficient position information for the block.

In this disclosure, the term "coding" refers to encoding that occurs at the encoder or decoding that occurs at the decoder. Similarly, the term "coder" refers to an encoder, a decoder, or a combined encoder/decoder ("CODEC"). The terms coder, encoder, decoder and CODEC all refer to specific machines designed for the coding (encoding and/or decoding) of video data consistent with this disclosure.

Coding the last significant coefficient position information for the block prior to coding the significant coefficient position information for the block has the effect of separating these coding steps, which may enable coding the information in parallel, and may enable using coding systems that have lower complexity than other systems. For example, rather than coding the information in an interleaved manner, e.g., by coding a significant coefficient flag followed by coding a last significant coefficient flag for each coefficient of the block according to the scanning order, as performed according to some techniques, the techniques of this disclosure separate the coding of the information. As such, using the techniques of this disclosure may enable coding the information using parallel coding algorithms, and may result in using coding systems that have lower complexity than other systems to code the information.

Additionally, availability of the last significant coefficient position information prior to coding the significant coefficient position information may enable using the last significant coefficient position information to code the information itself and other information for the block. In some examples, the last significant coefficient position information may be used as a context for coding the information itself, and for coding the significant coefficient position information, for example, when performing a context adaptive entropy coding process (e.g., a context adaptive binary arithmetic coding (CABAC) process) that includes applying a context model based on the context. Using the last significant coefficient position information in this manner may result in using accurate statistics to code the information itself, and to code the significant coefficient position information, which may enable coding the information more efficiently, e.g., using a smaller number of bits, than when using other methods. For example, the context model may provide the statistics, or probability estimates, for the last significant coefficient position information or the significant coefficient position information used to code the information as part of performing the context adaptive entropy coding process, e.g., a CABAC process. Furthermore, the probability estimates for the context model may be updated based on the coded information to reflect which last significant coefficient position information or significant coefficient position information is more or less likely to occur given the context. In particular, the updated probability estimates for the context model may be used for coding subsequent blocks of video data using the same context model.

In other examples, the last significant coefficient position information may be used as syntax information for coding the information itself, and for coding the significant coefficient position information, which may once again enable using coding systems that have lower complexity than other systems, and more efficient coding methods than other methods.

As one example, the last significant coefficient position information may be used as syntax information to determine how the information itself is to be coded, e.g., using different techniques to code the information depending on the position of the last significant coefficient within the block according to the scanning order, which may enable coding the information more efficiently than when using other methods. For example, in some cases, the significant coefficients, including the last significant coefficient, of the block may be concentrated in a subset of block positions, e.g., early in the scanning order, while in other cases, the coefficients may be located throughout the block, e.g., over all, or most of the scanning order. In this example, coding the one-dimensional position may require using fewer bits than coding the two-dimensional position when the last significant coefficient is located early in the scanning order. Similarly, coding the two-dimensional position may require using fewer bits than coding the one-dimensional position when the last significant coefficient is located later in the scanning order.

Rather than coding the last significant coefficient position information using a fixed method, e.g., by coding the one-dimensional position or the two-dimensional position, the techniques of this disclosure may code a flag that indicates whether the last significant coefficient is located within a range of positions within the block. For example, the range may correspond to positions within the block that occur relatively early in the scanning order. The techniques may further code the one-dimensional position when the last significant coefficient is located within the range, and otherwise code the two-dimensional position. Using the last significant coefficient position information in this manner may enable coding the information more efficiently than when using the fixed method, or other methods.

As another example, the last significant coefficient position information may be used as syntax information to determine a context for coding the significant coefficient position information, for example, when performing a context adaptive entropy coding process (e.g., a CABAC process) that includes applying a context model based on the context. For example, the significance of the coefficients located before the last significant coefficient within the block according to the scanning order may be coded in a reversed scanning order, starting from the last significant coefficient, and proceeding to the first coefficient in the scanning order. In this example, the significance of each coefficient may be coded by using the significance of previously coded coefficients as a context, which may result in using accurate statistics, or probability estimates, to code the significant coefficient position information, and enable coding the information more efficiently than when using other methods.

As still another example, the last significant coefficient position information may be used as syntax information to jointly code the significant coefficient position information. For example, the significant coefficient position information may be coded by arranging multiple coefficients located before the last significant coefficient within the block according to the scanning order into one or more groups, and jointly coding the significance of the coefficients within each group. Using the last significant coefficient position information in this manner may enable coding the significant coefficient position information itself in parallel, which may once again enable using coding systems that have lower complexity than other systems, and coding the information more efficiently than when using other methods.

The techniques of this disclosure may be used with any context adaptive entropy coding methodology, including CABAC, probability interval partitioning entropy coding (PIPE), or another context adaptive entropy coding methodology. CABAC is described in this disclosure for purposes of illustration, but without limitation as to the techniques broadly described in this disclosure. Also, the techniques may be applied to coding of other types of data generally, e.g., in addition to video data.

Accordingly, the techniques of this disclosure may enable using coding systems that have lower complexity relative to other systems, and more efficient coding methods relative to other methods, when coding the last significant coefficient position information for the block and the significant coefficient position information for the block. In this manner, there may be a relative bit savings for a coded bitstream including the information, and a relative reduction in complexity for a system used to code the information, when using the techniques of this disclosure.

FIG. 1 is a block diagram that illustrates an example of a video encoding and decoding system 10 that may implement techniques for coding last significant coefficient position information for a block of video data prior to coding significant coefficient position information for the block, consistent with the techniques of this disclosure. As shown in FIG. 1, system 10 includes a source device 12 that transmits encoded video to a destination device 14 via a communication channel 16. Source device 12 and destination device 14 may comprise any of a wide range of devices. In some cases, source device 12 and destination device 14 may comprise wireless communication devices, such as wireless handsets, so-called cellular or satellite radiotelephones, or any wireless devices that can communicate video information over a communication channel 16, in which case communication channel 16 is wireless.

The techniques of this disclosure, however, which concern coding last significant coefficient position information for a block of video data prior to coding significant coefficient position information for the block, are not necessarily limited to wireless applications or settings. These techniques may generally apply to any scenario where encoding or decoding is performed, including over-the-air television broadcasts, cable television transmissions, satellite television transmissions, streaming Internet video transmissions, encoded digital video that is encoded onto a storage medium or retrieved and decoded from a storage medium, or other scenarios. Accordingly, communication channel 16 is not required and the techniques of this disclosure may apply to settings where encoding is applied or where decoding is applied, e.g., without any data communication between encoding and decoding devices.

In the example of FIG. 1, source device 12 includes a video source 18, video encoder 20, a modulator/demodulator (modem) 22 and a transmitter 24. Destination device 14 includes a receiver 26, a modem 28, a video decoder 30, and a display device 32. In accordance with this disclosure, video encoder 20 of source device 12 and/or video decoder 30 of destination device 14 may be configured to apply the techniques for coding last significant coefficient position information for a block of video data prior to coding significant coefficient position information for the block. In other examples, a source device and a destination device may include other components or arrangements. For example, source device 12 may receive video data from an external video source 18, such as an external camera. Likewise, destination device 14 may interface with an external display device, rather than including an integrated display device.

The illustrated system 10 of FIG. 1 is merely one example. Techniques for coding last significant coefficient position information for a block of video data prior to coding significant coefficient position information for the block may be performed by any digital video encoding and/or decoding device. Although generally the techniques of this disclosure are performed by a video encoding device, the techniques may also be performed by a video encoder/decoder, typically referred to as a "CODEC." Moreover, the techniques of this disclosure may also be performed by a video preprocessor. Source device 12 and destination device 14 are merely examples of such coding devices in which source device 12 generates coded video data for transmission to destination device 14. In some examples, devices 12, 14 may operate in a substantially symmetrical manner such that each of devices 12, 14 includes video encoding and decoding components. Hence, system 10 may support one-way or two-way video transmission between video devices 12, 14, e.g., for video streaming, video playback, video broadcasting, or video telephony.

Video source 18 of source device 12 may include a video capture device, such as a video camera, a video archive containing previously captured video, and/or a video feed from a video content provider. As a further alternative, video source 18 may generate computer graphics-based data as the source video, or a combination of live video, archived video, and computer-generated video. In some cases, if video source 18 is a video camera, source device 12 and destination device 14 may form so-called camera phones or video phones. As mentioned above, however, the techniques described in this disclosure may be applicable to video coding in general, and may be applied to wireless and/or wired applications. In each case, the captured, pre-captured, or computer-generated video may be encoded by video encoder 20. The encoded video information may then be modulated by modem 22 according to a communication standard, and transmitted to destination device 14 via transmitter 24. Modem 22 may include various mixers, filters, amplifiers or other components designed for signal modulation. Transmitter 24 may include circuits designed for transmitting data, including amplifiers, filters, and one or more antennas.

Receiver 26 of destination device 14 receives information over channel 16, and modem 28 demodulates the information. Again, the video encoding process described above may implement one or more of the techniques described herein to code last significant coefficient position information for a block of video data prior to coding significant coefficient position information for the block. The information communicated over channel 16 may include syntax information defined by video encoder 20, which is also used by video decoder 30, that includes syntax elements that describe characteristics and/or processing of blocks of video data (e.g., macroblocks, or coding units), e.g., last significant coefficient position information and significant coefficient position information for the blocks, and other information. Display device 32 displays the decoded video data to a user, and may comprise any of a variety of display devices such as a cathode ray tube (CRT), a liquid crystal display (LCD), a plasma display, an organic light emitting diode (OLED) display, or another type of display device.

In the example of FIG. 1, communication channel 16 may comprise any wireless or wired communication medium, such as a radio frequency (RF) spectrum or one or more physical transmission lines, or any combination of wireless and wired media. Communication channel 16 may form part of a packet-based network, such as a local area network, a wide-area network, or a global network such as the Internet. Communication channel 16 generally represents any suitable communication medium, or collection of different communication media, for transmitting video data from source device 12 to destination device 14, including any suitable combination of wired or wireless media. Communication channel 16 may include routers, switches, base stations, or any other equipment that may be useful to facilitate communication from source device 12 to destination device 14. In other examples, encoding or decoding devices may implement techniques of this disclosure without any communication between such devices. For example, an encoding device may encode and store an encoded bitstream consistent with the techniques of this disclosure. Alternatively, a decoding device may receive or retrieve an encoded bitstream, and decode the bitstream consistent with the techniques of this disclosure.

Video encoder 20 and video decoder 30 may operate according to a video compression standard, such as the ITU-T H.264 standard, alternatively referred to as MPEG-4, Part 10, Advanced Video Coding (AVC). The techniques of this disclosure, however, are not limited to any particular coding standard. Other examples include MPEG-2, ITU-T H.263, and the High Efficiency Video Coding (HEVC) standard presently under development. In general, the techniques of this disclosure are described with respect to HEVC, but it should be understood that these techniques may be used in conjunction with other video coding standards as well. Although not shown in FIG. 1, in some aspects, video encoder 20 and video decoder 30 may each be integrated with an audio encoder and decoder, and may include appropriate MUX-DEMUX units, or other hardware and software, to handle encoding of both audio and video in a common data stream or separate data streams. If applicable, MUX-DEMUX units may conform to the ITU H.223 multiplexer protocol, or other protocols such as the user datagram protocol (UDP).

Video encoder 20 and video decoder 30 each may be implemented as any of a variety of suitable encoder and decoder circuitry, such as one or more microprocessors, digital signal processors (DSPs), application specific integrated circuits (ASICs), field programmable gate arrays (FPGAs), discrete logic, software, hardware, firmware or any combinations thereof. Each of video encoder 20 and video decoder 30 may be included in one or more encoders or decoders, either of which may be integrated as part of a combined encoder/decoder (CODEC) in a respective camera, computer, mobile device, subscriber device, broadcast device, set-top box, server, or the like.

A video sequence typically includes a series of video frames. A group of pictures (GOP) generally comprises a series of one or more video frames. A GOP may include syntax data in a header of the GOP, a header of one or more frames of the GOP, or elsewhere, that describes a number of frames included in the GOP. Each frame may include frame syntax data that describes an encoding mode for the respective frame. A video encoder, e.g., video encoder 20, typically operates on video blocks within individual video frames in order to encode the video data. According to the ITU-T H.264 standard, a video block may correspond to a macroblock or a partition of a macroblock. According to other standards, e.g., HEVC described in greater detail below, a video block may correspond to a coding unit (e.g., a largest coding unit), or a partition of a coding unit. The video blocks may have fixed or varying sizes, and may differ in size according to a specified coding standard. Each video frame may include a plurality of slices, i.e., portions of the video frame. Each slice may include a plurality of video blocks, which may be arranged into partitions, also referred to as sub-blocks.

Depending on the specified coding standard, video blocks may be partitioned into various "N×N" sub-block sizes, such as 16×16, 8×8, 4×4, 2×2, and so forth. In this disclosure, "N×N" and "N by N" may be used interchangeably to refer to the pixel dimensions of the block in terms of vertical and horizontal dimensions, e.g., 16×16 pixels or 16 by 16 pixels. In general, a 16×16 block will have sixteen pixels in a vertical direction (y=16) and sixteen pixels in a horizontal direction (x=16). Likewise, an N×N block generally has N pixels in a vertical direction and N pixels in a horizontal direction, where N represents a nonnegative integer value. The pixels in a block may be arranged in rows and columns. Moreover, blocks need not necessarily have the same number of pixels in the horizontal direction as in the vertical direction. For example, blocks may comprise N×M pixels, where M is not necessarily equal to N. As one example, in the ITU-T H.264 standard, blocks that are 16 by 16 pixels in size may be referred to as macroblocks, and blocks that are less than 16 by 16 pixels may be referred to as partitions of a 16 by 16 macroblock. In other standards, e.g., HEVC, blocks may be defined more generally with respect to their size, for example, as coding units and partitions thereof, each having a varying, rather than a fixed size.

Video blocks may comprise blocks of pixel data in the pixel domain, or blocks of transform coefficients in the transform domain, e.g., following application of a transform, such as a discrete cosine transform (DCT), an integer transform, a wavelet transform, or a conceptually similar transform to residual data for a given video block, wherein the residual data represents pixel differences between video data for the block and predictive data generated for the block. In some cases, video blocks may comprise blocks of quantized transform coefficients in the transform domain, wherein, following application of a transform to residual data for a given video block, the resulting transform coefficients are also quantized.

Block partitioning serves an important purpose in block-based video coding techniques. Using smaller blocks to code video data may result in better prediction of the data for locations of a video frame that include high levels of detail, and may therefore reduce the resulting error (i.e., deviation of the prediction data from source video data), represented as residual data. While potentially reducing the residual data, such techniques may, however, require additional syntax information to indicate how the smaller blocks are partitioned relative to a video frame, and may result in an increased coded video bitrate. Accordingly, in some techniques, block partitioning may depend on balancing the desirable reduction in residual data against the resulting increase in bitrate of the coded video data due to the additional syntax information.

In general, blocks and the various partitions thereof (i.e., sub-blocks) may be considered video blocks. In addition, a slice may be considered to be a plurality of video blocks (e.g., macroblocks, or coding units), and/or sub-blocks (partitions of macroblocks, or sub-coding units). Each slice may be an independently decodable unit of a video frame. Alternatively, frames themselves may be decodable units, or other portions of a frame may be defined as decodable units. Furthermore, a GOP, also referred to as a sequence, may be defined as a decodable unit.

Efforts are currently in progress to develop a new video coding standard, currently referred to as High Efficiency Video Coding (HEVC). The emerging HEVC standard may also be referred to as H.265. The standardization efforts are based on a model of a video coding device referred to as the HEVC Test Model (HM). The HM presumes several capabilities of video coding devices over devices according to, e.g., ITU-T H.264/AVC. For example, whereas H.264 provides nine intra-prediction encoding modes, HM provides as many as thirty-five intra-prediction encoding modes, e.g., based on the size of a block being intra-prediction coded.

HM refers to a block of video data as a coding unit (CU). A CU may refer to a rectangular image region that serves as a basic unit to which various coding tools are applied for compression. In H.264, it may also be called a macroblock. Syntax data within a bitstream may define a largest coding unit (LCU), which is a largest CU in terms of the number of pixels. In general, a CU has a similar purpose to a macroblock of H.264, except that a CU does not have a size distinction. Thus, a CU may be partitioned, or "split" into sub-CUs.

An LCU may be associated with a quadtree data structure that indicates how the LCU is partitioned. In general, a quadtree data structure includes one node per CU of an LCU, where a root node corresponds to the LCU, and other nodes correspond to sub-CUs of the LCU. If a given CU is split into four sub-CUs, the node in the quadtree corresponding to the split CU includes four child nodes, each of which corresponds to one of the sub-CUs. Each node of the quadtree data structure may provide syntax information for the corresponding CU. For example, a node in the quadtree may include a split flag for the CU, indicating whether the CU corresponding to the node is split into four sub-CUs. Syntax information for a given CU may be defined recursively, and may depend on whether the CU is split into sub-CUs.

A CU that is not split (i.e., a CU corresponding a terminal, or "leaf" node in a given quadtree) may include one or more prediction units (PUs). In general, a PU represents all or a portion of the corresponding CU, and includes data for retrieving a reference sample for the PU for purposes of performing prediction for the CU. For example, when the CU is intra-mode encoded, the PU may include data describing an intra-prediction mode for the PU. As another example, when the CU is inter-mode encoded, the PU may include data defining a motion vector for the PU. The data defining the motion vector may describe, for example, a horizontal component of the motion vector, a vertical component of the motion vector, a resolution for the motion vector (e.g., one-quarter pixel precision or one-eighth pixel precision), a reference frame to which the motion vector points, and/or a reference list (e.g., list 0 or list 1) for the motion vector. Data for the CU defining the one or more PUs of the CU may also describe, for example, partitioning of the CU into the one or more PUs. Partitioning modes may differ between whether the CU is uncoded, intra-prediction mode encoded, or inter-prediction mode encoded.

A CU having one or more PUs may also include one or more transform units (TUs). Following prediction for a CU using one or more PUs, as described above, a video encoder may calculate one or more residual blocks for the respective portions of the CU corresponding to the one of more PUs. The residual blocks may represent a pixel difference between the video data for the CU and the predicted data for the one or more PUs. A set of residual values may be transformed, scanned, and quantized to define a set of quantized transform coefficients. A TU may define a partition data structure that indicates partition information for the transform coefficients that is substantially similar to the quadtree data structure described above with reference to a CU. A TU is not necessarily limited to the size of a PU. Thus, TUs may be larger or smaller than corresponding PUs for the same CU. In some examples, the maximum size of a TU may correspond to the size of the corresponding CU. In one example, residual samples corresponding to a CU may be subdivided into smaller units using a quadtree structure known as "residual quad tree" (RQT). In this case, the leaf nodes of the RQT may be referred as the TUs, for which the corresponding residual samples may be transformed and quantized.

Following intra-predictive or inter-predictive encoding to produce predictive data and residual data, and following any transforms (such as the 4×4 or 8×8 integer transform used in H.264/AVC or a discrete cosine transform DCT) to produce transform coefficients, quantization of transform coefficients may be performed. Quantization generally refers to a process in which transform coefficients are quantized to possibly reduce the amount of data used to represent the coefficients. The quantization process may reduce the bit depth associated with some or all of the coefficients. For example, an n-bit value may be rounded down to an m-bit value during quantization, where n is greater than m.

Following quantization, entropy coding of the quantized data (i.e., quantized transform coefficients) may be performed. The entropy coding may conform to the techniques of this disclosure with respect to coding last significant coefficient position information for a block of video data prior to coding significant coefficient position information for the block, and may also use other entropy coding techniques, such as context adaptive variable length coding (CAVLC), CABAC, PIPE, or another entropy coding methodology. For example, coefficient values, represented as magnitudes and corresponding signs (e.g., "+1," or "−1") for the quantized transform coefficients may be encoded using the entropy coding techniques.

It should be noted that the prediction, transform, and quantization described above may be performed for any block of video data, e.g., to a PU and/or TU of a CU, or to a macroblock, depending on the specified coding standard. Accordingly, the techniques of this disclosure, relating to coding last significant coefficient position information for a block of video data prior to coding significant coefficient position information for the block, may apply to any block of video data, e.g., to any block of quantized transform coefficients, including a macroblock, or a TU of a CU. Furthermore, a block of video data (e.g., a macroblock, or a TU of a CU) may include each of a luminance component (Y), a first chrominance component (U), and a second chrominance component (V) of the corresponding video data. As such, the techniques of this disclosure may be performed for each of the Y, U, and V components of a given block of video data.

In order to encode blocks of video data as described above, information regarding position of significant coefficients within a given block may also be generated and encoded. Subsequently, the values of the significant coefficients may be encoded, as described above. In H.264/AVC and the emerging HEVC standard, when using a context adaptive entropy coding process, e.g., a CABAC process, the position of significant coefficients within a block of video data may be encoded prior to encoding the values of the significant coefficients. The process of encoding the position of all of the significant coefficients within the block may be referred to as significance map (SM) encoding. FIGS. 4A-4C, described in greater detail below, are conceptual diagrams that illustrate an example of a 4×4 block of quantized transform coefficients and corresponding SM data.

A typical SM encoding procedure may be described as follows. For a given block of video data, an SM may be encoded only if there is at least one significant coefficient within the block. Presence of significant coefficients within a given block of video data may be indicated in a coded block pattern (e.g., using syntax element "coded_block_pattern," or CBP), which is a binary value coded for a set of blocks (such as luminance and chrominance blocks) associated with an area of pixels in the video data. Each bit in the CBP is referred to as a coded block flag (e.g., corresponding to syntax element "coded_block_flag") and used to indicate whether there is at least one significant coefficient within its corresponding block. In other words, a coded block flag is a one-bit symbol indicating whether there are any significant coefficients inside a single block of transform coefficients, and a CBP is a set of coded block flags for a set of related video data blocks.

Figures 5A, 5B, 5C:
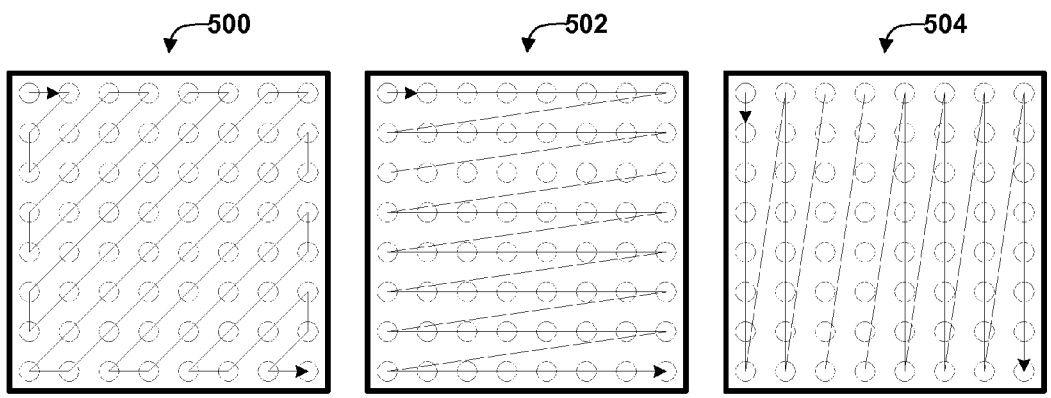
FIGS. 5A-5C are conceptual diagrams that illustrate examples of blocks of video data scanned using a zig-zag scanning order, a horizontal scanning order, and a vertical scanning order.

If a coded block flag indicates that no significant coefficients are present within the corresponding block (e.g., the flag equals "0"), no further information may be encoded for the block. However, if a coded block flag indicates that at least one significant coefficient exists within the corresponding block (e.g., the flag equals "1"), an SM may be encoded for the block by following a coefficient scanning order associated with the block. The scanning order may define the order in which the significance of each coefficient within the block is encoded as part of the SM encoding. In other words, scanning may serialize the two-dimensional block of coefficients to a one-dimensional representation to determine the significance of the coefficients. Different scanning orders (e.g., zigzag, horizontal, and vertical) may be used. FIGS. 5A-5C, also described in greater detail below, illustrate examples of some of the various scanning orders that may be used for 8×8 blocks of video data. The techniques of this disclose, however, may also apply with respect to a wide variety of other scanning orders, including a diagonal scanning order, scanning orders that are combinations of zigzag, horizontal, vertical, and/or diagonal scanning orders, as well as scanning orders that are partially zigzag, partially horizontal, partially vertical, and/or partially diagonal. In addition, the techniques of this disclosure may also consider a scanning order that is itself adaptive based on statistics associated with previously coded blocks of video data (e.g., blocks having the same block size or coding mode as the current block being coded). For example, an adaptive scanning order could be the scanning order associated with the block, in some cases.

Given a coded block flag that indicates that at least one significant coefficient exists within a given block, and a scanning order for the block, an SM for the block may be encoded as follows. The two-dimensional block of quantized transform coefficients may first be mapped into a one-dimensional array using the scanning order. For each coefficient in the array, following the scanning order, a one-bit significant coefficient flag (e.g., corresponding to syntax element "significant_coeff_flag") may be encoded. That is, each position in the array may be assigned a binary value, which may be set to "1" if the corresponding coefficient is significant and set to "0" if it is non-significant (i.e., zero). If a given significant coefficient flag equals "1," indicating that the corresponding coefficient is significant, an additional one-bit last significant coefficient flag (e.g., corresponding to syntax element "last_significant_coeff_flag") may also be encoded, which may indicate whether the corresponding coefficient is the last significant coefficient within the array (i.e., within the block given the scanning order). Specifically, each last significant coefficient flag may be set to "1" if the corresponding coefficient is the last significant coefficient within the array, and set to "0" otherwise. If the last array position is reached in this manner, and the SM encoding process was not terminated by a last significant coefficient flag equal to "1," then the last coefficient in the array (and thereby the block given the scanning order) may be inferred to be significant, and no last significant coefficient flag may be encoded for the last array position.

FIGS. 4B-4C are conceptual diagrams that illustrate examples of sets of significant coefficient flags and last significant coefficient flags, respectively, corresponding to SM data for the block depicted in FIG. 4A, presented in map, rather than array form. It should be noted that significant coefficient flags and last significant coefficient flags, as described above, may be set to different values (e.g., a significant coefficient flag may be set to "0" if the corresponding coefficient is significant, and "1" if it is non-significant, and a last significant coefficient flag may be set to "0" if the corresponding coefficient is the last significant coefficient, and "1" if it is not the last significant coefficient) in other examples.

After the SM is encoded, as described above, the value of each significant coefficient (i.e., each significant coefficient's magnitude and sign, e.g., indicated by syntax elements "coeff_abs_level_minus1" and "coeff_sign_flag," respectively) in the block may also be encoded.

One drawback of the techniques described above is that the decision regarding coding last significant coefficient position information, e.g., last_significant_coeff_flag, for a particular coefficient of a block is dependent on that coefficient's corresponding significant coefficient position information, e.g., significant_coeff_flag. As a result of using the interleaved coding techniques described above, a video coder used to code the information may have greater complexity relative to other systems. Furthermore, the last significant coefficient position information and the significant coefficient position information may consume a high percentage of the overall compressed video bitrate if coded inefficiently, e.g., using context models containing inaccurate statistics when coding the information by performing a context adaptive entropy coding process, e.g., a CABAC process, or without using other useful syntax information. Therefore, proper context model design and application, and using other useful syntax information, are very important to achieving efficient coding of the last significant coefficient position information and the significant coefficient position information, and to effective overall video data compression.

Accordingly, this disclosure describes techniques that may enable using coding systems that have lower complexity (and/or improved compression) relative to other systems when coding the last significant coefficient position information and the significant coefficient position information, and coding the information more efficiently than when using other methods. In particular, this disclosure provides techniques for coding last significant coefficient position information for a block of video data prior to coding significant coefficient position information for the block. Coding the last significant coefficient position information for the block prior to coding the significant coefficient position information for the block has the effect of separating these coding steps, which may enable coding the information in parallel, and may enable using coding systems that have lower complexity than other systems.

Additionally, this disclosure provides techniques for using the last significant coefficient position information to code the information itself and the significant coefficient position information. In some examples, the last significant coefficient position information may be used as a context for coding the information itself, and for coding the significant coefficient position information, for example, when performing a context adaptive entropy coding process (e.g., a CABAC process) that includes applying a context model based on the context. In other examples, the last significant coefficient position information may be used as syntax information for coding the information itself, and for coding the significant coefficient position information.

As one example, video encoder 20 of source device 12 may be configured to encode certain blocks of video data (e.g., one or more macroblocks, or TUs of a CU), and video decoder 30 of destination device 14 may be configured to receive the encoded video data from video encoder 20, e.g., from modem 28 and receiver 26. In accordance with the techniques of this disclosure, as one example, video encoder 20 and/or video decoder 30 may be configured to code information that identifies a position of a last significant coefficient within the block according to a scanning order associated with the block prior to coding information that identifies positions of other significant coefficients within the block, wherein to code the information that identifies the position of the last significant coefficient within the block according to the scanning order, video encoder 20 and/or video decoder 30 may be configured to perform at least one of the following: code a one-dimensional position within the block that identifies the position of the last significant coefficient within the block according to the scanning order; code a two-dimensional position within the block that identifies the position of the last significant coefficient within the block according to the scanning order; and code a flag that indicates whether the last significant coefficient within the block according to the scanning order is located within a range of positions within the block, and code the one-dimensional position within the block when the last significant coefficient within the block according to the scanning order is located within the range, and otherwise code the two-dimensional position within the block.

As one example, to code the one-dimensional position within the block, video decoder 20 and/or video decoder 30 may be configured to code the last significant coefficient position information using the scanning order. For example, video encoder 20 and/or video decoder 30 may code a bit, or a "bin," for each of one or more coefficients in the scanning order, starting with the first coefficient in the scanning order, and ending with the last significant coefficient. In this example, video encoder 20 and/or video decoder 30 may code each bin by performing a context adaptive entropy coding process (e.g., CABAC process) that includes applying a context model based on at least one context, wherein the at least one context may include a position of the coefficient corresponding to the bin within the block according to the scanning order. The probability estimates for the context model used to code each bin may indicate the probability of the bin being equal to a particular value (e.g., "0" or "1").

As another example, to code the two-dimensional position within the block, video encoder 20 and/or video decoder 30 may be configured to use the last significant coefficient position information as a context for coding the information itself. In the following examples, the two-dimensional position may comprise horizontal and vertical coordinates (e.g., x- and y-coordinates) of the last significant coefficient position within the block, where the horizontal coordinate corresponds to a column number of the position, and the vertical coordinate corresponds to a row number of the position. For example, the row and column numbers may be relative to row and column numbers corresponding to a reference, or "origin," position within the block, e.g., the top left block position, also referred to as the "DC" position.

Additionally, in the following examples, each coordinate may be represented as a sequence of one or more bins, or "binarized," wherein the sequence comprises a unary codeword that includes the one or more bins. Once again, the probability estimates for the context model used to code each bin may indicate the probability of the bin being equal to a particular value (e.g., "0" or "1"). In these examples, each bin of a given unary codeword may correspond to a row or column number, starting from the row or column of the origin position within the block, and ending with the row or column corresponding to the last significant coefficient position within the block. In some examples, the bin corresponding to the last significant coefficient position may be set to a value of "0," while all remaining bins of the codeword may be set to a value of "1." In other examples, the bins may be set to other values. It should be noted that, in other examples consistent with the techniques of this disclosure, other types of codewords, e.g., truncated unary codewords, exponential Golomb codewords, concatenated codewords, as well as combinations of various coding techniques, may be used.

In one example, video encoder 20 and/or video decoder 30 may code each bin of a unary codeword for a given coordinate by performing a context adaptive entropy coding process (e.g., a CABAC process) that includes applying a context model based on at least one context, wherein the at least one context may include a position of the bin within the unary codeword. As previously described, the position of the bin within the unary codeword may correspond to a row or column number of a position within the block corresponding to the bin. In other words, the context used to code the bin may be a position within the block in the x- or y-direction that corresponds to the bin.

In some cases, the horizontal and the vertical coordinates of the last significant coefficient position may be correlated. For example, if the horizontal coordinate equals a small value, the vertical coordinate is more likely to equal a small rather than a large value. That is, different values of one coordinate may result in different statistics for the other coordinate, i.e., different probability estimates for bins of a unary codeword for the other coordinate. As such, when coding one coordinate of the last significant coefficient position using statistics corresponding to the coordinate, for example, when performing a context adaptive entropy coding process (e.g., a CABAC process), using statistics that include information about a value of the other coordinate may result in the statistics being accurate and, therefore, may enable efficient coding.

Accordingly, in another example, when coding the last significant coefficient position information in cases where one coordinate (e.g., vertical) is coded after another coordinate (e.g., horizontal), video encoder 20 and/or video decoder 30 may code each bin of a unary codeword for the one coordinate by performing a context adaptive entropy coding process (e.g., a CABAC process) that includes applying a context model based on at least one context, wherein the at least one context may include a position of the bin within the unary codeword, as previously described, and a value of the previously coded other coordinate.

Similarly, in some cases, different values of a bin of a unary codeword for one coordinate of the last significant coefficient position may result in different probability estimates for a bin of a unary codeword for the other coordinate. As such, when coding a bin of a unary codeword for one coordinate of the last significant coefficient position using probability estimates corresponding to the bin, as described above, using probability estimates that include information about a value of a bin, e.g., a corresponding bin, of a unary codeword for the other coordinate may result in the probability estimates being accurate, and, therefore, may enable efficient coding.

For example, to code the horizontal coordinate and the vertical coordinate, video encoder 20 and/or video decoder 30 may be configured to code at least one bin of the sequence corresponding to one of the coordinates based at least in part on a value of at least one bin of the sequence corresponding to the other coordinate. For example, the at least one bin of the sequence corresponding to the other coordinate may be a bin that corresponds to the at least one bin of the sequence corresponding to the one of the coordinates, e.g., the bins may be located in the same or similar bin positions within their respective codewords. As one example, to code the at least one bin of the sequence corresponding to the one of the coordinates based at least in part on the value of the at least one bin of the sequence corresponding to the other coordinate, video encoder 20 and/or video decoder 30 may be configured to perform a context adaptive entropy coding process that includes applying a context model based on at least one context, wherein the at least one context includes the value of the at least one bin of the sequence corresponding to the other coordinate. Accordingly, in still another example, when coding the last significant coefficient position information, video encoder 20 and/or video decoder 30 may code the horizontal and the vertical coordinates in an interleaved manner using previously coded bins as contexts. That is, video encoder 20 and/or video decoder 30 may code each bin of a unary codeword for a given coordinate by performing a context adaptive entropy coding process (e.g., a CABAC process) that includes applying a context model based on at least one context, wherein the at least one context may include a position of the bin within the unary codeword, as previously described, and a value of one or more previously coded bins of a unary codeword for the other coordinate.

Additionally, video encoder 20 and/or video decoder 30 may be configured to code the one or more bins of the sequence corresponding to the one coordinate and the one or more bins of the sequence corresponding to the other coordinate in an interleaved manner, generally. In some examples, video encoder 20 and/or video decoder 30 may code individual bins of each codeword in an interleaved manner. In other examples, video encoder 20 and/or video decoder 30 may code groups of bins of each codeword in an interleaved manner. For example, at least one bin of each of the one or more bins of the sequence corresponding to the one coordinate and the one or more bins of the sequence corresponding to the other coordinate may comprise a bin encoded using a regular coding mode, and at least one bin of each of the sequences may comprise a bin coded using a bypass coding mode.

In this example, to code the one or more bins of the sequence corresponding to the one coordinate and the one or more bins of the sequence corresponding to the other coordinate in the interleaved manner, video encoder 20 and/or video decoder 30 may be configured to code the at least one bin of the one or more bins of the sequence corresponding to the one coordinate coded using the regular coding mode prior to coding the at least one bin of the one or more bins of the sequence corresponding to the other coordinate coded using the regular coding mode, followed by coding the at least one bin of the one or more bins of the sequence corresponding to the one coordinate coded using the bypass coding mode prior to coding the at least one bin of the one or more bins of the sequence corresponding to the other coordinate coded using the bypass coding mode. In other examples, video encoder 20 and/or video decoder 30 may be configured to code the bins of the sequences coded using the bypass coding mode together.

In still another example, video encoder 20 may arrange the block coefficients into a continuous sequence based on the scanning order, i.e., serialize the coefficients, and map the coefficients into a second block using a second scanning order, wherein the second block is different than the first block, and the second scanning order is different than the first scanning order. Subsequently, video encoder 20 may encode a last significant coefficient position within the second block according to the second scanning order using horizontal and vertical coordinates, as previously described. Video decoder 30 may, in turn, decode the horizontal and vertical coordinates of the last significant coefficient position within the second block according to the second scanning order, arrange the block coefficients into a continuous sequence based on the second scanning order, and map the coefficients into a third, different block using a third, different scanning order.

In this example, significant coefficients, including the last significant coefficient, of the original block may be more likely to be located earlier rather than later in the original scanning order. Video encoder 20 and/or video decoder 30 performing the above steps may result in the probability of a given position within the second block containing the last significant coefficient varying depending on the horizontal and the vertical coordinates of the position. For example, in cases where the second scanning order is the horizontal scanning order, the probability of the last significant coefficient being located in a first row of the second block may be higher than the probability of the last significant coefficient being located in later rows. Also, for a given row, the probability of the last significant coefficient being located in a first column (i.e., early in the row) of the second block may also be higher than the probability of the last significant coefficient being located in later columns (i.e., later in the row). In other words, different values of one coordinate may result in different probability estimates for bins of a unary codeword for the other coordinate. Additionally, different positions of the bins of the unary codeword for the other coordinate within the codeword may result in different probability estimates for the bins of the codeword. That is, different row or column numbers of positions within the second block corresponding to the bins may result in different probability estimates for the bins. A similar phenomenon may occur when the second scanning order is another scanning order, e.g., the vertical scanning order.

In this example, when coding one coordinate of the last significant coefficient position within the second block using statistics corresponding to the one coordinate, i.e., probability estimates for bins of a unary codeword for the one coordinate, using statistics that include information about a value of the other coordinate, and positions of the bins of the unary codeword for the one coordinate within the codeword, may result in the statistics being accurate and, therefore, may enable efficient coding. As such, in this example, when coding the last significant coefficient position information in cases where one coordinate is coded after another coordinate, video encoder 20 and/or video decoder 30 may code each bin of a unary codeword for the one coordinate by performing a context adaptive entropy coding process (e.g., a CABAC process) that includes applying a context model based on at least one context, wherein the at least one context may include a position of the bin within the unary codeword, as previously described, and a value of the previously coded other coordinate.

As illustrated by the examples above, video encoder 20 and/or video decoder 30 may use the last significant coefficient position information as a context for coding the information itself. In other examples, video encoder 20 and/or video decoder 30 may use the last significant coefficient position information as a context for coding the significant coefficient position information, e.g., by performing a context adaptive entropy coding process (e.g., a CABAC process) that includes applying a context model based on the context. In these examples, the probability estimates for the context model used to code the significant coefficient position information may indicate the probability of a particular coefficient being significant (e.g., probability of a significant coefficient flag for the coefficient being equal "0" or "1"). Specifically, video encoder 20 and/or video decoder 30 may code the significance of coefficients located before the last significant coefficient within the block according to the scanning order using the last significant coefficient position as a context.

As one example, the last significant coefficient position being located above a given position threshold in the scanning order may correspond to one context, while the position being located at, or below the position threshold may correspond to another context. In this example, the probability that a particular one of the coefficients is significant may vary depending on whether the coefficients are located earlier or later in the scanning order, as indicated by the last significant coefficient position. That is, different last significant coefficient positions may result in different statistics for the significance of the coefficients.

In a similar manner as described above, in this example, when coding the significant coefficient position information using the corresponding statistics, i.e., probability estimates for the significance of each coefficient, using statistics that include information about the last significant coefficient position may result in the statistics being accurate and, therefore, may enable efficient coding. Accordingly, in this example, when coding the significant coefficient position information, video encoder 20 and/or video decoder 30 may code the significance of each coefficient by performing a context adaptive entropy coding process (e.g., a CABAC process) that includes applying a context model based on at least one context, wherein the at least one context may include the last significant coefficient position, and e.g., a position of the coefficient within the block according to the scanning order.

As another example, video encoder 20 and/or video decoder 30 may use the last significant coefficient position information as syntax information for coding the significant coefficient position information. In one example, video encoder 20 and/or video decoder 30 may use the last significant coefficient position information to code the significant coefficient position information, using the significant coefficient position information itself as a context.

For example, video encoder 20 and/or video decoder 30 may code the significant coefficient position information by coding the significance of the coefficients located before the last significant coefficient within the block according to the scanning order in a reversed scanning order, starting from the last significant coefficient, and proceeding to the first coefficient in the scanning order (e.g., corresponding to the DC position). Video encoder 20 and/or video decoder 30 may code the significance of each coefficient by using the significance of previously coded coefficients as a context, e.g., once again by performing a context adaptive entropy coding process (e.g., a CABAC process) that includes applying a context model based on the context.

In this manner, the probability estimates for the context model used to code the significance of each coefficient may incorporate knowledge of significance of coefficients located later in the original scanning order, which may result in using accurate probability estimates and, therefore, may enable efficient coding. Moreover, such significance information cannot be obtained using other techniques, because, for a given coefficient, significance of coefficients located later in the original scanning order may not be known.

As still another example, video encoder 20 and/or video decoder 30 may use the last significant coefficient position information to jointly code the significant coefficient position information. For example, according to some techniques, the significance of the coefficients is coded one coefficient at a time. In other words, the determination whether the coefficients are significant is made sequentially for each coefficient according to the scanning order. According to the techniques of this disclosure, video encoder 20 and/or video decoder 30 may use the last significant coefficient position information to arrange multiple coefficients located before the last significant coefficient within the block according to the scanning order into one or more groups, and jointly code the significance of the coefficients within each group, which once again may enable parallel coding implementations and efficient coding.

For example, for each group, video encoder 20 and/or video decoder 30 may generate a flag indicating whether the coefficients within the group are all zero-valued, and, when at least one of the coefficients is significant, a significant coefficient flag for each of the coefficients, indicating whether the respective coefficient is significant.

As still another example, video encoder 20 and/or video decoder 30 may use the last significant coefficient position information as syntax information for coding the information itself. For example, in some cases, the significant coefficients, including the last significant coefficient, of the block may be concentrated in a subset of block positions, e.g., early in the scanning order and within close proximity to the DC position, while in other cases, the coefficients may be located throughout the block, e.g., over all, or most of the scanning order.

In this example, coding a one-dimensional last significant coefficient position may require using fewer bits than coding a two-dimensional last significant coefficient position when the last significant coefficient is located early in the scanning order. Similarly, coding the two-dimensional position may require using fewer bits than coding the one-dimensional position when the last significant coefficient is located later in the scanning order.

As such, rather than coding the last significant coefficient position using a fixed method, e.g., by coding the one-dimensional or the two-dimensional position, video encoder 20 and/or video decoder 30 may exploit this phenomenon by coding a flag indicating whether the last significant coefficient is located within a range of positions within the block, and coding the one-dimensional position when the last significant coefficient is located within the range, and otherwise coding the two-dimensional position. In other words, video encoder 20 and/or video decoder 30 may use the position of the last significant coefficient relative to the range to indicate whether the last significant coefficient is located earlier or later in the scanning order.

For example, the range may be defined as a sub-block within the block, e.g., a 4×4 sub-block within the 16×16 block, or as a range of positions within the block according to the scanning order, e.g., first 10 positions in the scanning order. As such, video encoder 20 and/or video decoder 30 may code the last significant coefficient position information differently depending on the information itself, which may enable efficient coding.

Accordingly, the techniques of this disclosure may enable video encoder 20 and/or video decoder 30 to have lower complexity relative to other systems, and may enable video encoder 20 and/or video decoder 30 to code the last significant coefficient position information and the significant coefficient position information more efficiently than when using other methods. In this manner, there may be a relative bit savings for a coded bitstream including the information, and a relative reduction in complexity for video encoder 20 and/or video decoder 30 used to code the information, when using the techniques of this disclosure.

Video encoder 20 and video decoder 30 each may be implemented as any of a variety of suitable encoder or decoder circuitry, as applicable, such as one or more microprocessors, digital signal processors (DSPs), application specific integrated circuits (ASICs), field programmable gate arrays (FPGAs), discrete logic circuitry, software, hardware, firmware or any combinations thereof. Each of video encoder 20 and video decoder 30 may be included in one or more encoders or decoders, either of which may be integrated as part of a combined video encoder/decoder (CODEC). An apparatus including video encoder 20 and/or video decoder 30 may comprise an integrated circuit, a microprocessor, and/or a wireless communication device, such as a cellular telephone.

Figure 2:
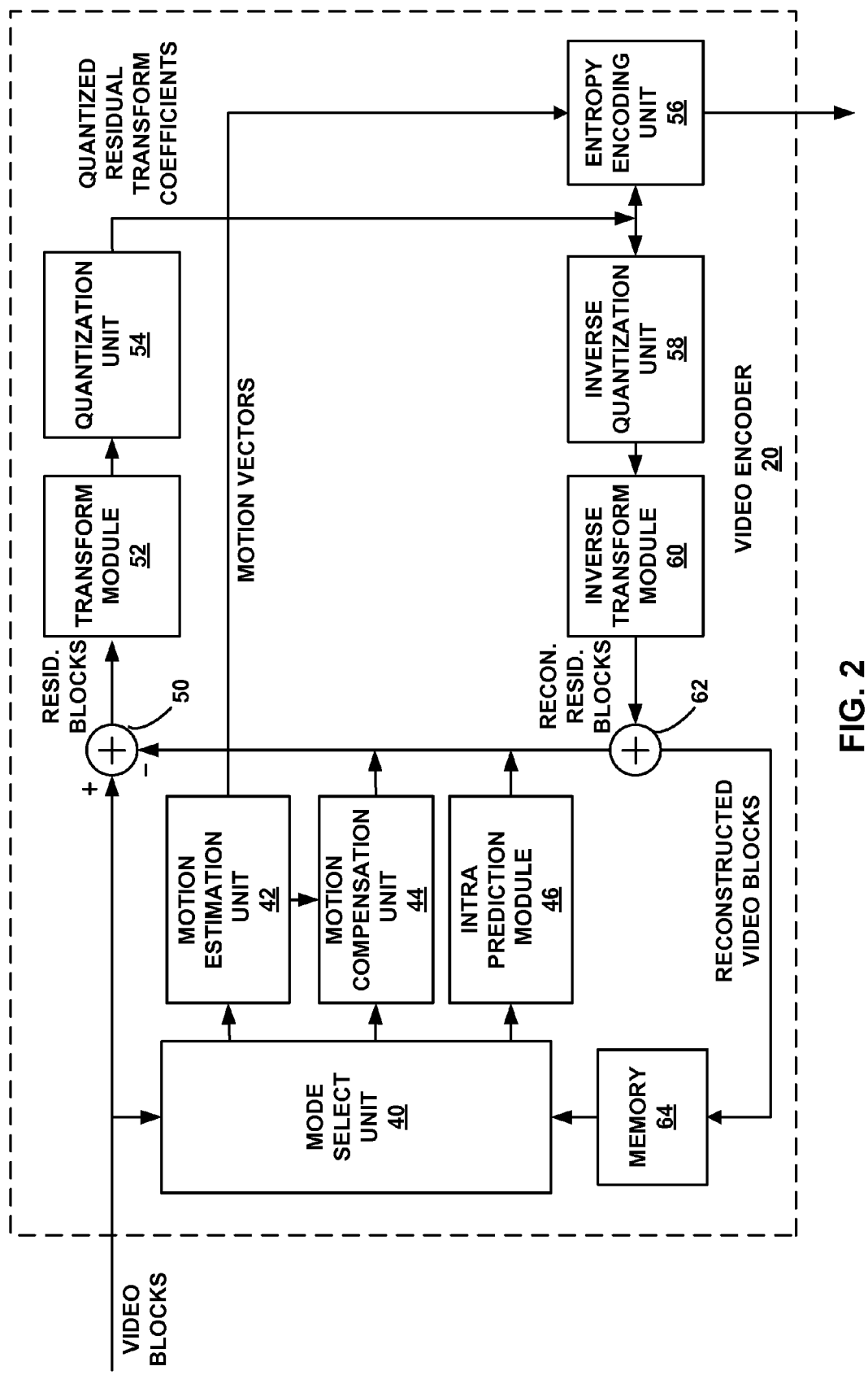
FIG. 2 is a block diagram that illustrates an example of a video encoder that may implement techniques for encoding last significant coefficient position information for a block of video data prior to encoding significant coefficient position information for the block, consistent with the techniques of this disclosure.

FIG. 2 is a block diagram that illustrates an example of a video encoder 20 that may implement techniques for encoding last significant coefficient position information for a block of video data prior to encoding significant coefficient position information for the block, consistent with the techniques of this disclosure. Video encoder 20 may perform intra- and inter-coding of blocks within video frames, including macroblocks, or CUs, or partitions or sub-partitions thereof. Intra-coding relies on spatial prediction to reduce or remove spatial redundancy in video within a given video frame. Inter-coding relies on temporal prediction to reduce or remove temporal redundancy in video within adjacent frames of a video sequence. Intra-mode (I-mode) may refer to any of several spatial based compression modes, and inter-modes, such as uni-directional prediction (P-mode) or bi-directional prediction (B-mode), may refer to any of several temporal-based compression modes.

As shown in FIG. 2, video encoder 20 receives a current block of video data within a video frame to be encoded. In the example of FIG. 2, video encoder 20 includes motion compensation unit 44, motion estimation unit 42, memory 64, summer 50, transform module 52, quantization unit 54, and entropy encoding unit 56. For video block reconstruction, video encoder 20 also includes inverse quantization unit 58, inverse transform module 60, and summer 62. A deblocking filter (not shown in FIG. 2) may also be included to filter block boundaries to remove blockiness artifacts from reconstructed video. If desired, the deblocking filter would typically filter the output of summer 62.

During the encoding process, video encoder 20 receives a video frame or slice to be coded. The frame or slice may be divided into multiple video blocks. Motion estimation unit 42 and motion compensation unit 44 may perform inter-predictive coding of a given received video block relative to one or more blocks in one or more reference frames to provide temporal compression. Intra-prediction module 46 may perform intra-predictive coding of a given received video block relative to one or more neighboring blocks in the same frame or slice as the block to be coded to provide spatial compression.

Mode select unit 40 may select one of the coding modes, i.e., one mode or multiple intra- or inter-coding modes, based on coding results (e.g., resulting coding rate and level of distortion), and based on a frame or slice type for the frame or slice including the given received block being coded, and provide the resulting intra- or inter-coded block to summer 50 to generate residual block data and to summer 62 to reconstruct the encoded block for use in a reference frame or reference slice. In general, intra-prediction involves predicting a current block relative to neighboring, previously coded blocks, while inter-prediction involves motion estimation and motion compensation to temporally predict the current block.

Motion estimation unit 42 and motion compensation unit 44 represent the inter-prediction elements of video encoder 20. Motion estimation unit 42 and motion compensation unit 44 may be highly integrated, but are illustrated separately for conceptual purposes. Motion estimation is the process of generating motion vectors, which estimate motion for video blocks. A motion vector, for example, may indicate the displacement of a predictive block within a predictive reference frame (or other coded unit) relative to the current block being coded within the current frame (or other coded unit). A predictive block is a block that is found to closely match the block to be coded, in terms of pixel difference, which may be determined by sum of absolute difference (SAD), sum of square difference (SSD), or other difference metrics. A motion vector may also indicate displacement of a partition of a block. Motion compensation may involve fetching or generating the predictive block based on the motion vector determined by motion estimation. Again, motion estimation unit 42 and motion compensation unit 44 may be functionally integrated, in some examples.

Motion estimation unit 42 may calculate a motion vector for a video block of an inter-coded frame by comparing the video block to video blocks of a reference frame in memory 64. Motion compensation unit 44 may also interpolate sub-integer pixels of the reference frame, e.g., an I-frame or a P-frame, for the purposes of this comparison. The ITU H.264 standard, as an example, describes two lists: list 0, which includes reference frames having a display order earlier than a current frame being encoded, and list 1, which includes reference frames having a display order later than the current frame being encoded. Therefore, data stored in memory 64 may be organized according to these lists.

Motion estimation unit 42 may compare blocks of one or more reference frames from memory 64 to a block to be encoded of a current frame, e.g., a P-frame or a B-frame. When the reference frames in memory 64 include values for sub-integer pixels, a motion vector calculated by motion estimation unit 42 may refer to a sub-integer pixel location of a reference frame. Motion estimation unit 42 and/or motion compensation unit 44 may also be configured to calculate values for sub-integer pixel positions of reference frames stored in memory 64 if no values for sub-integer pixel positions are stored in memory 64. Motion estimation unit 42 may send the calculated motion vector to entropy encoding unit 56 and motion compensation unit 44. The reference frame block identified by a motion vector may be referred to as an inter-predictive block, or, more generally, a predictive block. Motion compensation unit 44 may calculate prediction data based on the predictive block.

Intra-prediction module 46 may intra-predict a current block, as an alternative to the inter-prediction performed by motion estimation unit 42 and motion compensation unit 44, as described above. In particular, intra-prediction module 46 may determine an intra-prediction mode to use to encode a current block. In some examples, intra-prediction module 46 may encode a current block using various intra-prediction modes, e.g., during separate encoding passes, and intra-prediction module 46 (or mode select unit 40, in some examples) may select an appropriate intra-prediction mode to use from the tested modes. For example, intra-prediction module 46 may calculate rate-distortion values using a rate-distortion analysis for the various tested intra-prediction modes, and select the intra-prediction mode having the best rate-distortion characteristics among the tested modes. Rate-distortion analysis generally determines an amount of distortion (or error) between an encoded block and an original, unencoded block that was encoded to produce the encoded block, as well as a bit rate (that is, a number of bits) used to produce the encoded block. Intra-prediction module 46 may calculate ratios from the distortions and rates for the various encoded blocks to determine which intra-prediction mode exhibits the best rate-distortion value for the block.

After predicting a current block, e.g., using intra-prediction or inter-prediction, video encoder 20 may form a residual video block by subtracting the prediction data calculated by motion compensation unit 44 or intra-prediction module 46 from the original video block being coded. Summer 50 represents the component or components that may perform this subtraction operation. Transform module 52 may apply a transform, such as a discrete cosine transform (DCT) or a conceptually similar transform, to the residual block, producing a video block comprising residual transform coefficient values. Transform module 52 may perform other transforms, such as those defined by the H.264 standard, which are conceptually similar to DCT. Wavelet transforms, integer transforms, sub-band transforms or other types of transforms could also be used. In any case, transform module 52 may apply the transform to the residual block, producing a block of residual transform coefficients. The transform may convert the residual information from a pixel domain to a transform domain, such as a frequency domain. Quantization unit 54 may quantize the residual transform coefficients to further reduce bit rate. The quantization process may reduce the bit depth associated with some or all of the coefficients. The degree of quantization may be modified by adjusting a quantization parameter.

Following quantization, entropy encoding unit 56 may entropy code the quantized transform coefficients using the techniques of this disclosure for coding last significant coefficient position information for a block of video data prior to coding significant coefficient position information for the block. For other types of syntax elements, however, entropy encoding unit 56 may perform other entropy coding techniques, which may include CAVLC, CABAC, PIPE, or another entropy coding technique. Following the entropy coding by entropy encoding unit 56, the encoded video may be transmitted to another device or archived for later transmission or retrieval.

In some cases, entropy encoding unit 56 or another unit of video encoder 20 may be configured to perform other coding functions, in addition to entropy coding quantized transform coefficients as described above. For example, entropy encoding unit 56 may construct header information for the block (e.g., macroblock, CU, or LCU), or video frame containing the block, with appropriate syntax elements for transmission in the encoded video bitstream. According to some coding standards, such syntax elements may include last significant coefficient position information and significant coefficient position information for the block, as previously described. As also previously described, coding this information according to some techniques may require using coding systems that have greater complexity relative to other systems, and the resulting coded information may consume a high percentage of the overall compressed video bitrate if coded inefficiently. As such, this disclosure describes techniques that may enable using coding systems that have lower complexity relative to other systems when coding the last significant coefficient position information and the significant coefficient position information, and coding the information more efficiently than when using other methods.

As one example, entropy encoding unit 56 of video encoder 20 may be configured to encode certain blocks of video data (e.g., one or more macroblocks, or TUs of a CU). For example, as described above with reference to FIG. 1, entropy encoding unit 56 may be configured to code information that identifies a position of a last significant coefficient within a block of video data according to a scanning order associated with the block prior to coding information that identifies positions of other significant coefficients within the block, wherein to code the information that identifies the position of the last significant coefficient within the block according to the scanning order, entropy encoding unit 56 may be configured to perform at least one of the following: code a one-dimensional position within the block that identifies the position of the last significant coefficient within the block according to the scanning order; code a two-dimensional position within the block that identifies the position of the last significant coefficient within the block according to the scanning order; and code a flag that indicates whether the last significant coefficient within the block according to the scanning order is located within a range of positions within the block, and code the one-dimensional position within the block when the last significant coefficient within the block according to the scanning order is located within the range, and otherwise code the two-dimensional position within the block.

As one example, to code the one-dimensional position within the block, entropy encoding unit 56 may be configured to, for each of one or more coefficients associated with the block, starting with a first coefficient within the block according to the scanning order and ending with the last significant coefficient within the block according to the scanning order, and proceeding according to the scanning order, determine whether the coefficient is the last significant coefficient within the block according to the scanning order, and generate a last significant coefficient flag that indicates whether the coefficient is the last significant coefficient within the block according to the scanning order. Entropy encoding unit 56 may be further configured to arrange the last significant coefficient flags for the one or more coefficients into a continuous sequence based on the scanning order, and encode the sequence.

As another example, to code the two-dimensional position within the block, entropy encoding unit 56 may be configured to determine a horizontal coordinate of the position of the last significant coefficient within the block according to the scanning order, determine a vertical coordinate of the position of the last significant coefficient within the block according to the scanning order, and encode the horizontal coordinate and the vertical coordinate. In this example, the block may be a first block, the scanning order may be a first scanning order, and entropy encoding unit 56 may be further configured to arrange coefficients associated with a second block into a continuous sequence based on a second scanning order, wherein the second block is different than the first block, and the second scanning order is different than the first scanning order, and map the sequence into the first block using the first scanning order to generate the first block.

Also in this example, as previously described, to encode each of the horizontal coordinate and the vertical coordinate, entropy encoding unit 56 may be configured to binarize the respective coordinate, such that the coordinate comprises a sequence of one or more bins, and encode the sequence. For example, the sequence of one or more bins may comprise one of a unary codeword, a truncated unary codeword, an exponential Golomb codeword, and a concatenated codeword.

As one example, the truncated unary codeword may comprise, in the event the respective coordinate has a value that is less than a predetermined truncated value, a unary codeword comprising a variable number of a first symbol (e.g., "1"), the variable number corresponding to the value of the coordinate, followed by a second symbol (e.g., "0"), wherein the first symbol is different than the second symbol, and in the event the coordinate has a value that is greater than or equal to the truncated value, a predetermined number of the first symbol, the predetermined number corresponding to the truncated value.

As another example, the concatenated codeword may comprise a concatenation of a first codeword (e.g., a codeword generated using a first coding method) and a second codeword (e.g., a codeword generated using a second coding method), wherein the first codeword is different than the second codeword. In this example, the concatenated codeword may be used in instances where the block of video data is sufficiently large such that using a unary codeword, or a truncated unary codeword, to represent the respective coordinate may require more bits than using the concatenated codeword.

As also previously described, to encode the horizontal coordinate and the vertical coordinate, entropy encoding unit 56 may be configured to encode at least one bin of the sequence corresponding to one of the coordinates based at least in part on a value of at least one bin of the sequence corresponding to the other coordinate. As one example, to encode the at least one bin of the sequence corresponding to the one of the coordinates based at least in part on the value of the at least one bin of the sequence corresponding to the other coordinate, entropy encoding unit 56 may be configured to perform a context adaptive entropy coding process that includes applying a context model based on at least one context, wherein the at least one context includes the value of the at least one bin of the sequence corresponding to the other coordinate.

Additionally, entropy encoding unit 56 may be configured to encode the one or more bins of the sequence corresponding to the one coordinate and the one or more bins of the sequence corresponding to the other coordinate in an interleaved manner. For example, at least one bin of each of the one or more bins of the sequence corresponding to the one coordinate and the one or more bins of the sequence corresponding to the other coordinate may comprise a bin coded using a regular coding mode, and at least one bin of each of the sequences may comprise a bin coded using a bypass coding mode.

In this example, to encode the one or more bins of the sequence corresponding to the one coordinate and the one or more bins of the sequence corresponding to the other coordinate in the interleaved manner, entropy encoding unit 56 may be configured to encode the at least one bin of the one or more bins of the sequence corresponding to the one coordinate coded using the regular coding mode prior to encoding the at least one bin of the one or more bins of the sequence corresponding to the other coordinate coded using the regular coding mode, followed by encoding the at least one bin of the one or more bins of the sequence corresponding to the one coordinate coded using the bypass coding mode prior to encoding the at least one bin of the one or more bins of the sequence corresponding to the other coordinate coded using the bypass coding mode. In other examples, entropy encoding unit 56 may be configured to encode the bins of the sequences coded using the bypass coding mode together.

As another example, to code the significant coefficient position information, wherein the scanning order may be a first scanning order, entropy encoding unit 56 may be configured to, for each of one or more coefficients associated with the block, starting with the last significant coefficient within the block according to the scanning order and ending with a first coefficient within the block according to the scanning order, and proceeding according to a second scanning order that is reversed relative to the first scanning order, determine whether the coefficient is a significant coefficient, and generate a significant coefficient flag that indicates whether the coefficient is a significant coefficient. Entropy encoding unit 56 may be further configured to arrange the significant coefficient flags for the one or more coefficients into a continuous sequence based on the second scanning order, and encode the sequence.

As another example, to code the significant coefficient position information, entropy encoding unit 56 may be configured to arrange one or more coefficients associated with the block, starting with a first coefficient within the block according to the scanning order and ending with the last significant coefficient within the block according to the scanning order, and proceeding according to the scanning order, into one or more groups, wherein each of the one or more groups comprises one or more of the coefficients. Entropy encoding unit 56 may be further configured to, for each of the one or more groups, determine whether the one or more of the coefficients are significant coefficients, and generate one or more flags, wherein the one or more flags include a group flag that indicates whether the one or more of the coefficients are all zero-valued (i.e., non-significant) coefficients, and, when at least one of the one or more of the coefficients is a significant coefficient, the one or more flags further include a significant coefficient flag for each of the one or more of the coefficients that indicates whether the respective coefficient is a significant coefficient. Entropy encoding unit 56 may be still further configured to arrange the one or more flags for the one or more groups into a continuous sequence based on the scanning order, and encode the sequence.

In still another example, to code the last significant coefficient position information, and to code the significant coefficient position information, entropy encoding unit 56 may be configured to perform a context adaptive entropy coding process (e.g., a CABAC process) that includes entropy encoding unit 56 applying a context model based on at least one context, wherein the at least one context includes one of the last significant coefficient position information, and the significant coefficient position information. As one example, to encode the sequence of one or more bins corresponding to each of the horizontal coordinate and the vertical coordinate, entropy encoding unit 56 may be configured to encode each bin of the sequence by performing a context adaptive entropy coding process that includes applying a context model based on at least one context, wherein the at least one context includes a position of the respective bin within the sequence. As previously described, the position of the bin within the sequence may correspond to a row or column number of a position within the block corresponding to the bin. In other words, the context used to code the bin may be a position within the block in the x- or y-direction that corresponds to the bin. In this example, entropy encoding unit 56 configured as described may enable entropy encoding unit 56 to code the information more efficiently, e.g., using a smaller number of bits, than when using other methods.

As such, the techniques of this disclosure may enable entropy encoding unit 56 to have lower complexity relative to other systems, and may enable entropy encoding unit 56 to code the last significant coefficient position information and the significant coefficient position information more efficiently than when using other methods. In this manner, there may be a relative bit savings for a coded bitstream including the information, and a relative reduction in complexity for entropy encoding unit 56 used to code the information, when using the techniques of this disclosure.

Inverse quantization unit 58 and inverse transform module 60 apply inverse quantization and inverse transformation, respectively, to reconstruct the residual block in the pixel domain, e.g., for later use as a reference block. Motion compensation unit 44 may calculate a reference block by adding the residual block to a predictive block of one of the frames of memory 64. Motion compensation unit 44 may also apply one or more interpolation filters to the reconstructed residual block to calculate sub-integer pixel values for use in motion estimation. Summer 62 adds the reconstructed residual block to the motion compensated prediction block produced by motion compensation unit 44 to produce a reconstructed video block for storage in memory 64. The reconstructed video block may be used by motion estimation unit 42 and motion compensation unit 44 as a reference block to inter-code a block in a subsequent video frame.

In this manner, video encoder 20 represents an example of a video coder configured to code information that identifies a position of a last significant coefficient within a block of video data according to a scanning order associated with the block prior to coding information that identifies positions of other significant coefficients within the block, wherein to code the information that identifies the position of the last significant coefficient within the block according to the scanning order, the video coder is configured to perform at least one of the following: code a one-dimensional position within the block that identifies the position of the last significant coefficient within the block according to the scanning order; code a two-dimensional position within the block that identifies the position of the last significant coefficient within the block according to the scanning order; and code a flag that indicates whether the last significant coefficient within the block according to the scanning order is located within a range of positions within the block, and code the one-dimensional position within the block when the last significant coefficient within the block according to the scanning order is located within the range, and otherwise code the two-dimensional position within the block.

Figure 3:
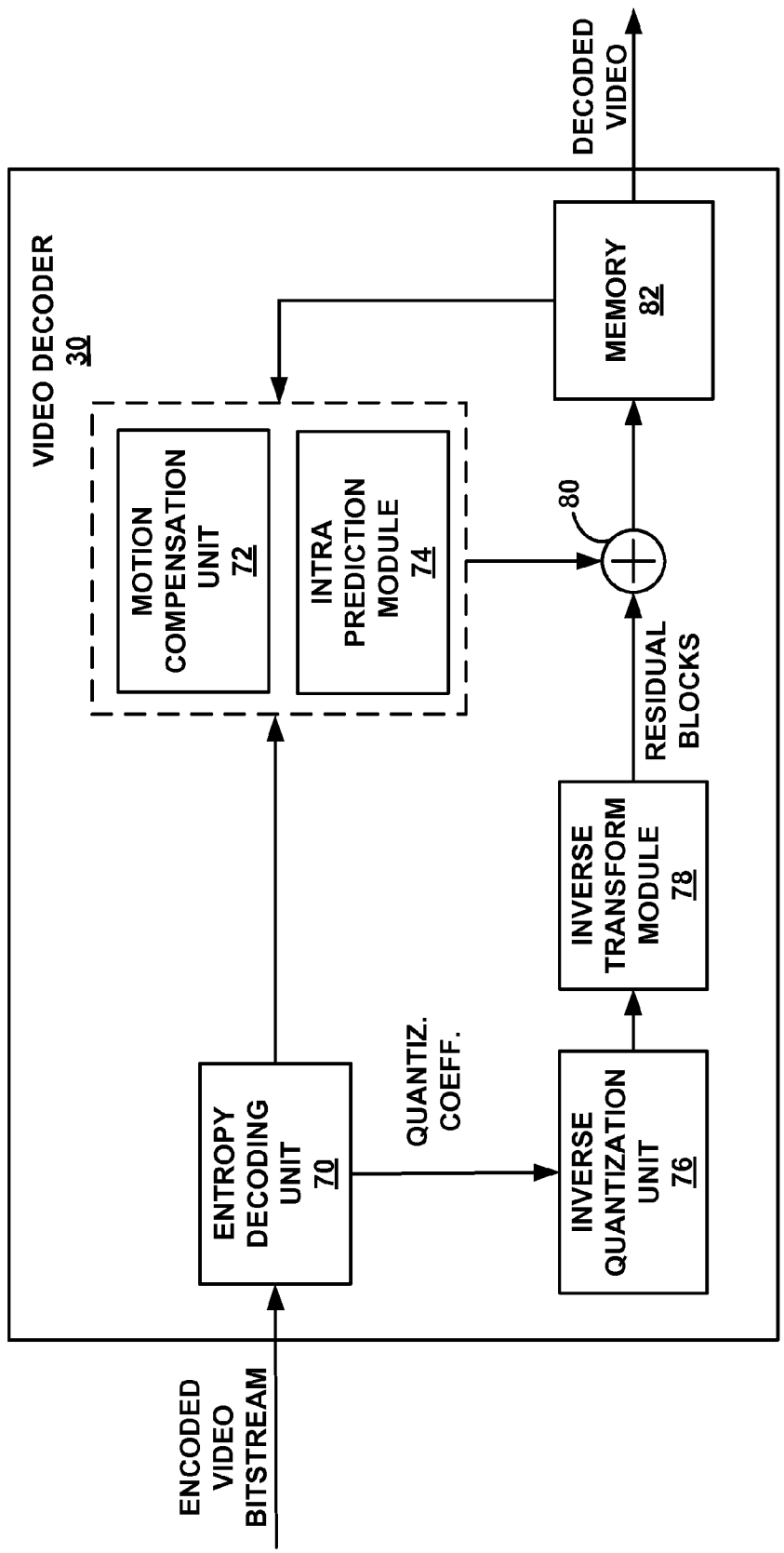
FIG. 3 is a block diagram that illustrates an example of a video decoder that may implement techniques for decoding encoded last significant coefficient position information for a block of video data prior to decoding encoded significant coefficient position information for the block, consistent with the techniques of this disclosure.

FIG. 3 is a block diagram that illustrates an example of a video decoder that may implement techniques for decoding encoded last significant coefficient position information for a block of video data prior to decoding encoded significant coefficient position information for the block, consistent with the techniques of this disclosure. In the example of FIG. 3, video decoder 30 includes an entropy decoding unit 70, motion compensation unit 72, intra-prediction module 74, inverse quantization unit 76, inverse transformation unit 78, memory 82 and summer 80. Video decoder 30 may, in some examples, perform a decoding pass generally reciprocal to the encoding pass described with respect to video encoder 20 (FIG. 2). Motion compensation unit 72 may generate prediction data based on motion vectors received from entropy decoding unit 70.

Video decoder 30 may be configured to receive encoded video data (e.g., one or more macroblocks, or TUs of a CU) from video encoder 20. In accordance with the techniques of this disclosure, as one example, video decoder 30 may be configured to code information that identifies a position of a last significant coefficient within a block of video data according to a scanning order associated with the block prior to coding information that identifies positions of other significant coefficients within the block, wherein to code the information that identifies the position of the last significant coefficient within the block according to the scanning order, video decoder 30 may be configured to perform at least one of the following: code a one-dimensional position within the block that identifies the position of the last significant coefficient within the block according to the scanning order; code a two-dimensional position within the block that identifies the position of the last significant coefficient within the block according to the scanning order; and code a flag that indicates whether the last significant coefficient within the block according to the scanning order is located within a range of positions within the block, and code the one-dimensional position within the block when the last significant coefficient within the block according to the scanning order is located within the range, and otherwise code the two-dimensional position within the block.

As one example, to code the one-dimensional position within the block, entropy decoding unit 70 may be configured to decode a continuous sequence of last significant coefficient flags for one or more coefficients associated with the block, starting with a first coefficient within the block according to the scanning order and ending with the last significant coefficient within the block according to the scanning order, and proceeding according to the scanning order, wherein each of the last significant coefficient flags indicates whether the respective coefficient is the last significant coefficient within the block according to the scanning order. Entropy decoding unit 70 may be further configured to, for each coefficient associated with the block, determine whether the coefficient is the last significant coefficient within the block according to the scanning order, based on the sequence.

As another example, to code the two-dimensional position within the block, entropy decoding unit 70 may be configured to decode a horizontal coordinate of the position of the last significant coefficient within the block according to the scanning order, and decode a vertical coordinate of the position of the last significant coefficient within the block according to the scanning order. Entropy decoding unit 70 may be further configured to, for each coefficient associated with the block, determine whether the coefficient is the last significant coefficient within the block according to the scanning order, based on the horizontal coordinate and the vertical coordinate. In this example, the block may be a first block, the scanning order may be a first scanning order, and entropy decoding unit 70 may be further configured to arrange the coefficients associated with the first block into a continuous sequence based on the first scanning order, and map the sequence into a second block using a second scanning order, wherein the second block is different than the first block, and the second scanning order is different than the first scanning order, to generate the second block. Entropy decoding unit 70 may be still further configured to, for each coefficient associated with the second block, determine whether the coefficient is the last significant coefficient within the second block according to the second scanning order, based on the determinations for the first block.

Also in this example, as previously described, each of the horizontal coordinate and the vertical coordinate may comprise a binarized coordinate, such that the coordinate comprises a sequence of one or more bins, and wherein to decode each of the horizontal coordinate and the vertical coordinate, entropy decoding unit 70 may be configured to decode the respective sequence. For example, the sequence of one or more bins may comprise one of a unary codeword, a truncated unary codeword, an exponential Golomb codeword, and a concatenated codeword.

As one example, the truncated unary codeword may comprise, in the event the respective coordinate has a value that is less than a predetermined truncated value, a unary codeword comprising a variable number of a first symbol (e.g., "1"), the variable number corresponding to the value of the coordinate, followed by a second symbol (e.g., "0"), wherein the first symbol is different than the second symbol, and in the event the coordinate has a value that is greater than or equal to the truncated value, a predetermined number of the first symbol, the predetermined number corresponding to the truncated value.

As another example, the concatenated codeword may comprise a concatenation of a first codeword (e.g., a codeword generated using a first coding method) and a second codeword (e.g., a codeword generated using a second coding method), wherein the first codeword is different than the second codeword. In this example, the concatenated codeword may be used in instances where the block of video data is sufficiently large such that using a unary codeword, or a truncated unary codeword, to represent the respective coordinate may require more bits than using the concatenated codeword.

As also previously described, to decode the horizontal coordinate and the vertical coordinate, entropy decoding unit 70 may be configured to decode at least one bin of the sequence corresponding to one of the coordinates based at least in part on a value of at least one bin of the sequence corresponding to the other coordinate. As one example, to decode the at least one bin of the sequence corresponding to the one of the coordinates based at least in part on the value of the at least one bin of the sequence corresponding to the other coordinate, entropy decoding unit 70 may be configured to perform a context adaptive entropy coding process that includes applying a context model based on at least one context, wherein the at least one context includes the value of the at least one bin of the sequence corresponding to the other coordinate.

Additionally, entropy decoding unit 70 may be configured to decode the one or more bins of the sequence corresponding to the one coordinate and the one or more bins of the sequence corresponding to the other coordinate in an interleaved manner. For example, at least one bin of each of the one or more bins of the sequence corresponding to the one coordinate and the one or more bins of the sequence corresponding to the other coordinate may comprise a bin encoded using a regular coding mode, and at least one bin of each of the sequences may comprise a bin coded using a bypass coding mode.

In this example, to decode the one or more bins of the sequence corresponding to the one coordinate and the one or more bins of the sequence corresponding to the other coordinate in the interleaved manner, entropy decoding unit 70 may be configured to decode the at least one bin of the one or more bins of the sequence corresponding to the one coordinate coded using the regular coding mode prior to decoding the at least one bin of the one or more bins of the sequence corresponding to the other coordinate coded using the regular coding mode, followed by decoding the at least one bin of the one or more bins of the sequence corresponding to the one coordinate coded using the bypass coding mode prior to decoding the at least one bin of the one or more bins of the sequence corresponding to the other coordinate coded using the bypass coding mode. In other examples, entropy decoding unit 70 may be configured to decode the bins of the sequences coded using the bypass coding mode together.

As another example, to code the significant coefficient position information, wherein the scanning order may be a first scanning order, entropy decoding unit 70 may be configured to decode a continuous sequence of significant coefficient flags for one or more coefficients associated with the block, starting with the last significant coefficient within the block according to the scanning order and ending with a first coefficient within the block according to the scanning order, and proceeding according to a second scanning order that is reversed relative to the first scanning order, wherein each of the significant coefficient flags indicates whether the respective coefficient is a significant coefficient. Entropy decoding unit 70 may be further configured to, for each coefficient associated with the block, determine whether the coefficient is a significant coefficient, based on the sequence.

As another example, to code the significant coefficient position information, entropy decoding unit 70 may be configured to decode a continuous sequence of flags for one or more coefficients associated with the block arranged into one or more groups, starting with a first coefficient within the block according to the scanning order and ending with the last significant coefficient within the block according to the scanning order, and proceeding according to the scanning order, wherein each of the one or more groups comprises one or more of the coefficients. In this example, for each of the one or more groups, the sequence may comprise one or more flags, including a group flag that indicates whether the one or more of the coefficients are all zero-valued (i.e., non-significant) coefficients, and, when at least one of the one or more of the coefficients is a significant coefficient, a significant coefficient flag for each of the one or more of the coefficients that indicates whether the respective coefficient is a significant coefficient. Entropy decoding unit 70 may be further configured to, for each coefficient associated with the block, determine whether the coefficient is a significant coefficient, based on the sequence.

In still another example, to code the last significant coefficient position information, and to code the significant coefficient position information, entropy decoding unit 70 may be configured to perform a context adaptive entropy coding process (e.g., a CABAC process) that includes entropy decoding unit 70 applying a context model based on at least one context, wherein the at least one context includes one of the last significant coefficient position information, and the significant coefficient position information. As one example, to decode the sequence of one or more bins corresponding to each of the horizontal coordinate and the vertical coordinate, entropy decoding unit 70 may be configured to decode each bin of the sequence by performing a context adaptive entropy coding process that includes applying a context model based on at least one context, wherein the at least one context includes a position of the respective bin within the sequence. As previously described, the position of the bin within the sequence may correspond to a row or column number of a position within the block corresponding to the bin. In other words, the context used to code the bin may be a position within the block in the x- or y-direction that corresponds to the bin. In this example, entropy decoding unit 70 configured as described may enable entropy decoding unit 70 to code the information more efficiently, e.g., using a smaller number of bits, than when using other methods.

As such, the techniques of this disclosure may enable entropy decoding unit 70 to have lower complexity relative to other systems, and may enable entropy decoding unit 70 to code the last significant coefficient position information and the significant coefficient position information more efficiently than when using other methods. In this manner, there may be a relative bit savings for a coded bitstream including the information, and a relative reduction in complexity for entropy decoding unit 70 used to code the information, when using the techniques of this disclosure.

Motion compensation unit 72 may use motion vectors received in the bitstream to identify a prediction block in reference frames in memory 82. Intra-prediction module 74 may use intra-prediction modes received in the bitstream to form a prediction block from spatially adjacent blocks.

Intra-prediction module 74 may use an indication of an intra-prediction mode for the encoded block to intra-predict the encoded block, e.g., using pixels of neighboring, previously decoded blocks. For examples in which the block is inter-prediction mode encoded, motion compensation unit 72 may receive information defining a motion vector, in order to retrieve motion compensated prediction data for the encoded block. In any case, motion compensation unit 72 or intra-prediction module 74 may provide information defining a prediction block to summer 80.

Inverse quantization unit 76 inverse quantizes, i.e., de-quantizes, the quantized block coefficients provided in the bitstream and decoded by entropy decoding unit 70. The inverse quantization process may include a conventional process, e.g., as defined by the H.264 decoding standard or as performed by the HEVC Test Model. The inverse quantization process may also include use of a quantization parameter $QP_Y$ calculated by video encoder 20 for each block to determine a degree of quantization and, likewise, a degree of inverse quantization that should be applied.

Inverse transform module 78 applies an inverse transform, e.g., an inverse DCT, an inverse integer transform, or a conceptually similar inverse transform process, to the transform coefficients in order to produce residual blocks in the pixel domain. Motion compensation unit 72 produces motion compensated blocks, possibly performing interpolation based on interpolation filters. Identifiers for interpolation filters to be used for motion estimation with sub-pixel precision may be included in the syntax elements. Motion compensation unit 72 may use interpolation filters as used by video encoder 20 during encoding of the video block to calculate interpolated values for sub-integer pixels of a reference block. Motion compensation unit 72 may determine the interpolation filters used by video encoder 20 according to received syntax information and use the interpolation filters to produce predictive blocks.

Motion compensation unit 72 uses some of the syntax information for the encoded block to determine sizes of blocks used to encode frame(s) of the encoded video sequence, partition information that describes how each block of a frame or slice of the encoded video sequence is partitioned, modes indicating how each partition is encoded, one or more reference frames (and reference frame lists) for each inter-encoded block or partition, and other information to decode the encoded video sequence. Intra-prediction module 74 may also use the syntax information for the encoded block to intra-predict the encoded block, e.g., using pixels of neighboring, previously decoded blocks, as described above.

Summer 80 sums the residual blocks with the corresponding prediction blocks generated by motion compensation unit 72 or intra-prediction module 74 to form decoded blocks. If desired, a deblocking filter may also be applied to filter the decoded blocks in order to remove blockiness artifacts. The decoded video blocks are then stored in memory 82, which provides reference blocks for subsequent motion compensation and also produces decoded video for presentation on a display device (such as display device 32 of FIG. 1).

In this manner, video decoder 30 represents an example of a video coder configured to code information that identifies a position of a last significant coefficient within a block of video data according to a scanning order associated with the block prior to coding information that identifies positions of other significant coefficients within the block, wherein to code the information that identifies the position of the last significant coefficient within the block according to the scanning order, the video coder is configured to perform at least one of the following: code a one-dimensional position within the block that identifies the position of the last significant coefficient within the block according to the scanning order; code a two-dimensional position within the block that identifies the position of the last significant coefficient within the block according to the scanning order; and code a flag that indicates whether the last significant coefficient within the block according to the scanning order is located within a range of positions within the block, and code the one-dimensional position within the block when the last significant coefficient within the block according to the scanning order is located within the range, and otherwise code the two-dimensional position within the block.

FIGS. 4A-4C are conceptual diagrams that illustrate an example of a block of video data and corresponding significant coefficient position information and last significant coefficient position information. As shown in FIG. 4A, a block of video data, e.g., a macroblock, or a TU of a CU, may include quantized transform coefficients. For example, as shown in FIG. 4A, block 400 may include quantized transform coefficients generated using prediction, transform, and quantization techniques previously described. Assume, for this example, that block 400 has a size of 2N×2N, wherein N equals to two. Accordingly, block 400 has a size of 4×4, and includes sixteen quantized transform coefficients, as also shown in FIG. 4A. Assume further, that the scanning order associated with block 400 is the zig-zag scanning order, as shown in FIG. 5A described in greater detail below.

In this example, a last significant coefficient within block 400 according to the zig-zag scanning order is a quantized transform coefficient equal to "1," located in position 406 within block 400. In other examples, as described above, a block may have a size that is smaller or larger than the size of block 400, and may include more or fewer quantized transform coefficients than block 400. In still other examples, the scanning order associated with block 400 may be a different scanning order, e.g., a horizontal scanning order, a vertical scanning order, a diagonal scanning order, or another scanning order.

FIG. 4B illustrates an example of significant coefficient flag data, i.e., significant coefficient flags represented in map, or block form, as previously described. In the example of FIG. 4B, block 402 may correspond to block 400 depicted in FIG. 4A. In other words, the significant coefficient flags of block 402 may correspond to the quantized transform coefficients of block 400. As shown in FIG. 4B, the significant coefficient flags of block 402 that are equal to "1" correspond to significant coefficients of block 400. Similarly, the significant coefficient flags of block 402 that are equal to "0" correspond to zero, or non-significant coefficients of block 400.

In this example, a significant coefficient flag of block 402 corresponding to the last significant coefficient within block 400 according to the zig-zag scanning order is a significant coefficient flag equal to "1," located in position 408 within block 402. In other examples, the values of significant coefficient flags used to indicate significant or non-significant coefficients may vary (e.g., significant coefficient flags equal to "0" may correspond to significant coefficients, and significant coefficient flags equal to "1" may correspond to non-significant coefficients).

FIG. 4C illustrates an example of last significant coefficient flag data, i.e., last significant coefficient flags represented in map, or block form, as also previously described. In the example of FIG. 4C, block 404 may correspond to block 400 and block 402 depicted in FIG. 4A and FIG. 4B, respectively. In other words, the last significant coefficient flags of block 404 may correspond to the quantized transform coefficients of block 400, and to the significant coefficient flags of block 402.

As shown in FIG. 4C, the last significant coefficient flag of block 404 that is equal to "1," located in position 410 within block 404, corresponds to a last significant coefficient of block 400, and to a last one of the significant coefficient flags of block 402 that are equal to "1," according to the zig-zag scanning order. Similarly, the last significant coefficient flags of block 404 that are equal to "0" (i.e., all remaining last significant coefficient flags) correspond to zero, or non-significant coefficients of block 400, and to all significant coefficient flags of block 402 that are equal to "1" other than the last one of such significant coefficient flags according to the zig-zag scanning order.

The values of the last significant coefficient flags used to indicate a last significant coefficient according to a scanning order may vary (e.g., a last significant coefficient flag equal to "0" may correspond to a last significant coefficient according to the scanning order, and last significant coefficient flags equal to "1" may correspond to all remaining coefficients). In any case, the significant coefficient flags of block 402, and the last significant coefficient flags of block 404, may be collectively referred to as SM data for block 400.

As described above, significant coefficient position information for a block of video data may be indicated by serializing significant coefficient flags for the block from a two-dimensional block representation, as depicted in block 402 shown in FIG. 4B, into a one-dimensional array, using a scanning order associated with the block. In the example of blocks 400-402 shown in FIGS. 4A-4B, again assuming the zig-zag scanning order, the significant coefficient position information for block 400 may be indicated by serializing the significant coefficient flags of block 402 into a one-dimensional array. That is, the significant coefficient position information for block 400 may be indicated by generating a sequence of significant coefficient flags of block 402 according to the zig-zag scanning order.

In this example, the generated sequence may correspond to a value "111111," representing the first 6 significant coefficient flags of block 402 according to the zig-zag scanning order. It should be noted that the generated sequence may contain significant coefficient flags corresponding to a range of block positions within block 400, starting from a first block position in the zig-zag scanning order (i.e., the DC position) and ending with a block position corresponding to the last significant coefficient of block 400 according to the zig-zag scanning order (i.e., corresponding to the last significant coefficient flag equal to "1" of block 404).

As also described above, according to the techniques of this disclosure, last significant coefficient position information for the block may be indicated using a one-dimensional position, indicating the last significant coefficient position within the block, e.g., by serializing last significant coefficient flags for the block from a two-dimensional block representation, as depicted in block 404 shown in FIG. 4C, into a one-dimensional array, using a scanning order associated with the block. In the example of blocks 400-404 shown in FIGS. 4A-4C, again assuming the zig-zag scanning order, the last significant coefficient position information for block 400 may be indicated by serializing the last significant coefficient flags of block 404 into a one-dimensional array. That is, the last significant coefficient position information for block 400 may be indicated by generating a sequence of last significant coefficient flags of block 404 according to the zig-zag scanning order. In this example, the generated sequence may correspond to a value "000001," representing the first 6 last significant coefficient flags of block 404 according to the zig-zag scanning order.

Once again, it should be noted that the generated sequence may contain last significant coefficient flags corresponding to a range of block positions within block 400, starting from the first block position in the zig-zag scanning order, and ending with the block position corresponding to the last significant coefficient of block 400 according to the zig-zag scanning order (i.e., corresponding to the last significant coefficient flag equal to "1" of block 404). Accordingly, in this example, no last significant coefficient flags following the last significant coefficient flag equal to "1" according to the zig-zag scanning order are included in the sequence. Generally speaking, last significant coefficient flags following a last significant coefficient flag equal to "1" according to a scanning order associated with a block of video data may not be needed to indicate last significant coefficient position information for the block. As such, in some examples, these flags are omitted from the generated sequence of last significant coefficient flags used to indicate the information.

It should also be noted, that, as described above, if the last significant coefficient is located within a last block position according to the scanning order (e.g., the bottom right block position), the generated sequence may not include a last significant coefficient flag corresponding to the last block position, because the position may be inferred to contain the last significant coefficient for the block. Accordingly, in this example, the generated sequence may correspond to a value "000000000000000," wherein the last significant coefficient flag corresponding to the last block position is not included in the sequence, and is inferred to equal "1."

As also described above, according to the techniques of this disclosure, the last significant coefficient position information for the block may be indicated using a two-dimensional position, e.g., using horizontal and vertical coordinates, indicating the last significant coefficient position within the block. For example, again with reference to FIGS. 4A-4C, the last significant coefficient position information for block 400 may be indicated using a horizontal coordinate equal to "2," and a vertical coordinate equal to "0." The coordinates may correspond to position 406 within block 400, where the reference, or origin position is the DC position, which corresponds to horizontal and vertical coordinates that are both equal to "0." As previously described, the coordinates may be represented using unary codewords. In this example, the horizontal coordinate may correspond to a unary codeword "110," and the vertical coordinate may correspond to a unary codeword "0."

In any case, as previously described, the last significant coefficient position information for the block, represented as the sequence of last significant coefficient flags, or the horizontal and the vertical coordinates, in turn represented as unary codewords, may be coded prior to coding the significant coefficient position information for the block, represented as the sequence of significant coefficient flags, which may enable coding the information in parallel, and may result in low coding system complexity. As also previously described, the last significant coefficient position information and the significant coefficient position information may each be coded using a context adaptive entropy coding process (e.g., a CABAC process) that includes applying a context model based on at least one context, wherein the at least one context may include one of the last significant coefficient position information and the significant coefficient position information, which may enable efficient coding, e.g., using a small number of bits to code the information.

In this manner, video encoder 20 of FIG. 2 and/or video decoder 30 of FIG. 3 may be configured to code information that identifies a position of a last significant coefficient within a block of video data according to a scanning order associated with the block prior to coding information that identifies positions of other significant coefficients within the block, wherein to code the information that identifies the position of the last significant coefficient within the block according to the scanning order, the video coder is configured to perform at least one of the following: code a one-dimensional position within the block that identifies the position of the last significant coefficient within the block according to the scanning order; code a two-dimensional position within the block that identifies the position of the last significant coefficient within the block according to the scanning order; and code a flag that indicates whether the last significant coefficient within the block according to the scanning order is located within a range of positions within the block, and code the one-dimensional position within the block when the last significant coefficient within the block according to the scanning order is located within the range, and otherwise code the two-dimensional position within the block.

FIGS. 5A-5C are conceptual diagrams that illustrate examples of blocks of video data scanned using a zig-zag scanning order, a horizontal scanning order, and a vertical scanning order, respectively. As shown in FIGS. 5A-5C, an 8×8 block of video data, e.g., a macroblock, or a TU of a CU, may include sixty-four quantized transform coefficients in corresponding block positions, denoted with circles. For example, blocks 500-504 may each include sixty-four quantized transform coefficients generated using prediction, transform, and quantization techniques previously described, again, wherein each corresponding block position is denoted with a circle. Assume, for this example, that blocks 500-504 have a size of 2N×2N, wherein N equals to four. Accordingly, blocks 500-504 have a size of 8×8.

As shown in FIG. 5A, the scanning order associated with block 500 is the zig-zag scanning order. The zig-zag scanning order scans the quantized transform coefficients of block 500 in a diagonal manner as indicated by the arrows in FIG. 5A. Similarly, as shown in FIGS. 5B and 5C, the scanning orders associated with blocks 502 and 504 are the horizontal scanning order and the vertical scanning order, respectively. The horizontal scanning order scans the quantized transform coefficients of block 502 in a horizontal line-by-line, or "raster" manner, while the vertical scanning order scans the quantized transform coefficients of block 504 in a vertical line-by-line, or "rotated raster" manner, also as indicated by the arrows in FIGS. 5B and 5C.

In other examples, as described above, a block may have a size that is smaller or larger than the size of blocks 500-504, and may include more or fewer quantized transform coefficients and corresponding block positions. In these examples, a scanning order associated with the block may scan the quantized transform coefficients of the block in a substantially similar manner as shown in the examples of 8×8 blocks 500-504 of FIGS. 5A-5C, e.g., a 4×4 block, or a 16×16 block, may be scanned following any of the scanning orders previously described.

As previously described, the techniques of this disclose may also apply with respect to a wide variety of other scanning orders, including a diagonal scanning order, scanning orders that are combinations of zigzag, horizontal, vertical, and/or diagonal scanning orders, as well as scanning orders that are partially zigzag, partially horizontal, partially vertical, and/or partially diagonal. In addition, the techniques of this disclosure may also consider a scanning order that is itself adaptive based on statistics associated with previously coded blocks of video data (e.g., blocks having the same block size or coding mode as the current block being coded). For example, an adaptive scanning order could be the scanning order associated with a block of video data, in some cases.

In this manner, video encoder 20 of FIG. 2 and/or video decoder 30 of FIG. 3 may be configured to code information that identifies a position of a last significant coefficient within a block of video data according to a scanning order (e.g., the zig-zag, horizontal, or vertical scanning order shown in FIGS. 5A-5C, respectively) associated with the block prior to coding information that identifies positions of other significant coefficients within the block, wherein to code the information that identifies the position of the last significant coefficient within the block according to the scanning order, video encoder 20 and/or video decoder 30 may be configured to perform at least one of the following: code a one-dimensional position within the block that identifies the position of the last significant coefficient within the block according to the scanning order; code a two-dimensional position within the block that identifies the position of the last significant coefficient within the block according to the scanning order; and code a flag that indicates whether the last significant coefficient within the block according to the scanning order is located within a range of positions within the block, and code the one-dimensional position within the block when the last significant coefficient within the block according to the scanning order is located within the range, and otherwise code the two-dimensional position within the block.

FIGS. 6A-6B are conceptual diagrams that illustrate examples of last significant coefficient position information for blocks of video data. In a similar manner as described above with reference to FIG. 4A, as shown in FIG. 6A, block 600 may include quantized transform coefficients. In this example, a last significant coefficient for block 600, once again according to the zig-zag scanning order, is a quantized transform coefficient equal to "1," located in position 604 within block 600. As previously described, according to the techniques of this disclosure, the last significant coefficient position information for block 600 may be indicated using a two-dimensional position, comprising a horizontal and a vertical coordinate. In this example, the last significant coefficient position information for block 600 may be indicated using a horizontal coordinate equal to "2," and a vertical coordinate equal to "0." In this example, the horizontal coordinate may correspond to a unary codeword "110," and the vertical coordinate may correspond to a unary codeword "0."

FIG. 6B illustrates an example of a block of quantized transform coefficients generated by arranging the coefficients of block 600 of FIG. 6A into a continuous sequence based on the scanning order associated with block 600 (e.g., the zig-zag scanning order), and mapping the sequence into block 602 using a horizontal scanning order. In this example, a last significant coefficient for block 602, this time according to the horizontal scanning order, is a quantized transform coefficient equal to "1," located in position 606 within block 602. As previously described, according to the techniques of this disclosure, the last significant coefficient position information for block 602 may be indicated using a two-dimensional position, comprising a horizontal and a vertical coordinate. In this example, the last significant coefficient position information for block 602 may be indicated using a horizontal coordinate equal to "1," and a vertical coordinate equal to "1," which may each correspond to a unary codeword "10."

As previously described, as a result of mapping the coefficients of block 600 into block 602 in the above-described manner, different values of one coordinate of the last significant coefficient position information for block 602 may result in different probability estimates for bins of a unary codeword for the other coordinate. Additionally, as also previously described, different positions of the bins of the unary codeword for the other coordinate within the codeword may result in different probability estimates for the bins of the codeword. That is, different row or column numbers of positions within block 602 corresponding to the bins may result in different probability estimates for the bins. As such, when coding one coordinate of the last significant coefficient position information after having coded the other coordinate, each bin of a unary codeword for the one coordinate may be coded by performing a context adaptive entropy coding process (e.g., a CABAC process) that includes applying a context model based on at least one context, wherein the at least one context may include a position of the bin within the unary codeword, as previously described, and a value of the previously coded other coordinate. In other examples, the sequence may be mapped into block 602 using a different scanning order, e.g., a vertical scanning order, which may result in different horizontal and vertical coordinates, and different probability estimates for the bins of the unary codewords for the horizontal and the vertical coordinates.

In this manner, video encoder 20 of FIG. 2 and/or video decoder 30 of FIG. 3 may be configured to code information that identifies a position of a last significant coefficient within a block of video data according to a scanning order associated with the block prior to coding information that identifies positions of other significant coefficients within the block, wherein to code the information that identifies the position of the last significant coefficient within the block according to the scanning order, video encoder 20 and/or video decoder 30 may be configured to perform at least one of the following: code a one-dimensional position within the block that identifies the position of the last significant coefficient within the block according to the scanning order; code a two-dimensional position within the block that identifies the position of the last significant coefficient within the block according to the scanning order; and code a flag that indicates whether the last significant coefficient within the block according to the scanning order is located within a range of positions within the block, and code the one-dimensional position within the block when the last significant coefficient within the block according to the scanning order is located within the range, and otherwise code the two-dimensional position within the block.

Figure 7:
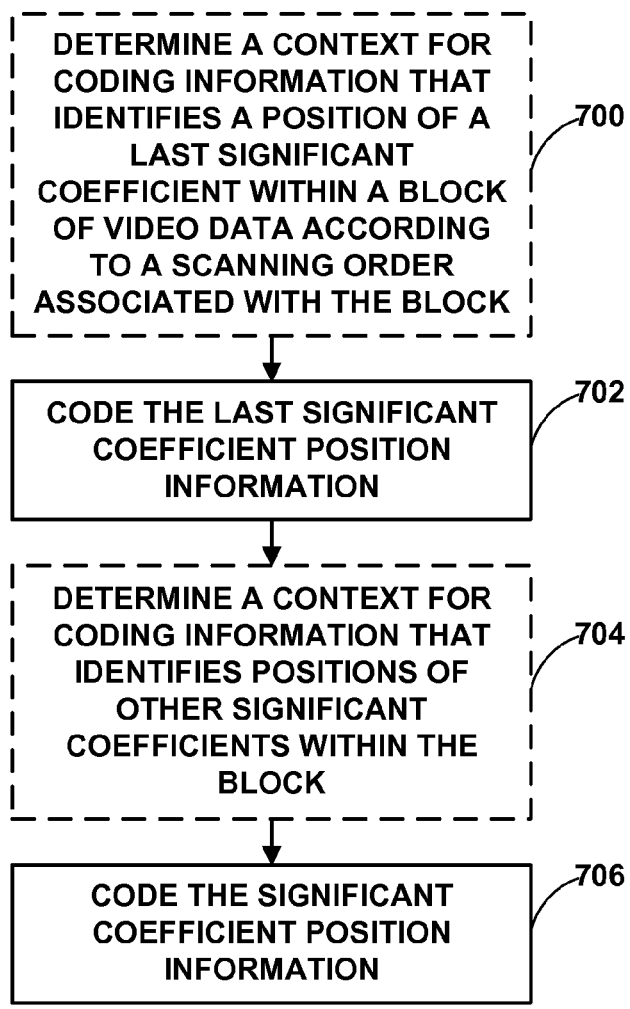
FIG. 7 is a flowchart that illustrates an example of a method for coding last significant coefficient position information for a block of video data prior to coding significant coefficient position information for the block.

FIG. 7 is a flowchart that illustrates an example of a method for coding last significant coefficient position information for a block of video data prior to coding significant coefficient position information for the block. The techniques of FIG. 7 may generally be performed by any processing unit or processor, whether implemented in hardware, software, firmware, or a combination thereof, and when implemented in software or firmware, corresponding hardware may be provided to execute instructions for the software or firmware. For purposes of example, the techniques of FIG. 7 are described with respect to video encoder 20 (FIGS. 1 and 2) and/or video decoder 30 (FIGS. 1 and 3), although it should be understood that other devices may be configured to perform similar techniques. Moreover, the steps illustrated in FIG. 7 may be performed in a different order or in parallel, and additional steps may be added and certain steps omitted, without departing from the techniques of this disclosure.

Initially, video encoder 20 and/or video decoder 30 may determine a context for coding information that identifies a position of a last significant coefficient within a block of video data according to a scanning order associated with the block (700). For example, the block may be a macroblock, or a TU of a CU. Furthermore, the scanning order associated with the block may be a zig-zag scanning order, a horizontal scanning order, a vertical scanning order, or another scanning order, as previously described. As also previously described, the last significant coefficient position information may be represented as a sequence of last significant coefficient flags, or as horizontal and vertical coordinates of the last significant coefficient position within the block. As also previously described, the context for coding the last significant coefficient position information may be the information itself.

Video encoder 20 and/or video decoder 30 may further code the last significant coefficient position information (702). For example, the information may be encoded in the case of video encoder 20, or decoded in the case of video decoder 30, by performing a context adaptive entropy coding process (e.g., a CABAC process) that includes applying a context model based on the determined context, as described above. In examples where the information is represented as a sequence of last significant coefficient flags, the context model may contain probability estimates that indicate the likelihood of a last significant coefficient flag being coded corresponding to the last significant coefficient for the block according to the scanning order (e.g., the last significant coefficient flag being equal to "0" or "1"). In examples where the information is represented using horizontal and vertical coordinates of the last significant coefficient position within the block, wherein each coordinate is further represented as a unary codeword, the context model may contain probability estimates that indicate the likelihood of a bin of a unary codeword for a given coordinate being coded being equal to a particular value (e.g., "0" or "1"). In any case, using these probability estimates, video encoder 20 and/or video decoder 30 may code the last significant coefficient position information by performing the context adaptive entropy coding process.

Video encoder 20 and/or video decoder 20 may further determine a context for coding the information that identifies the positions of the other significant coefficients within the block (704). As previously described, the significant coefficient position information may be represented as a sequence of significant coefficient flags. As also previously described, the context may include the last significant coefficient position information, and the significant coefficient position information.

Video encoder 20 and/or video decoder 30 may further code the significant coefficient position information (706). Once again, the information may be encoded in the case of video encoder 20, or decoded in the case of video decoder 30, by performing a context adaptive entropy coding process (e.g., a CABAC process) that includes applying a context model based on the determined context, as described above. In this example, the context model may contain probability estimates that indicate the likelihood of a significant coefficient flag being coded corresponding to a significant coefficient for the block (e.g., the significant coefficient flag being equal to "0" or "1"). Once again, using these probability estimates, video encoder 20 and/or video decoder 30 may code the significant coefficient position information by performing the context adaptive entropy coding process.

In this manner, the method of FIG. 7 represents an example of a method of coding information that identifies a position of a last significant coefficient within a block of video data according to a scanning order associated with the block prior to coding information that identifies positions of other significant coefficients within the block, wherein coding the information that identifies the position of the last significant coefficient within the block according to the scanning order includes at least one of the following: coding a one-dimensional position within the block that identifies the position of the last significant coefficient within the block according to the scanning order; coding a two-dimensional position within the block that identifies the position of the last significant coefficient within the block according to the scanning order; and coding a flag that indicates whether the last significant coefficient within the block according to the scanning order is located within a range of positions within the block, and coding the one-dimensional position within the block when the last significant coefficient within the block according to the scanning order is located within the range, and otherwise coding the two-dimensional position within the block.

Figure 8:
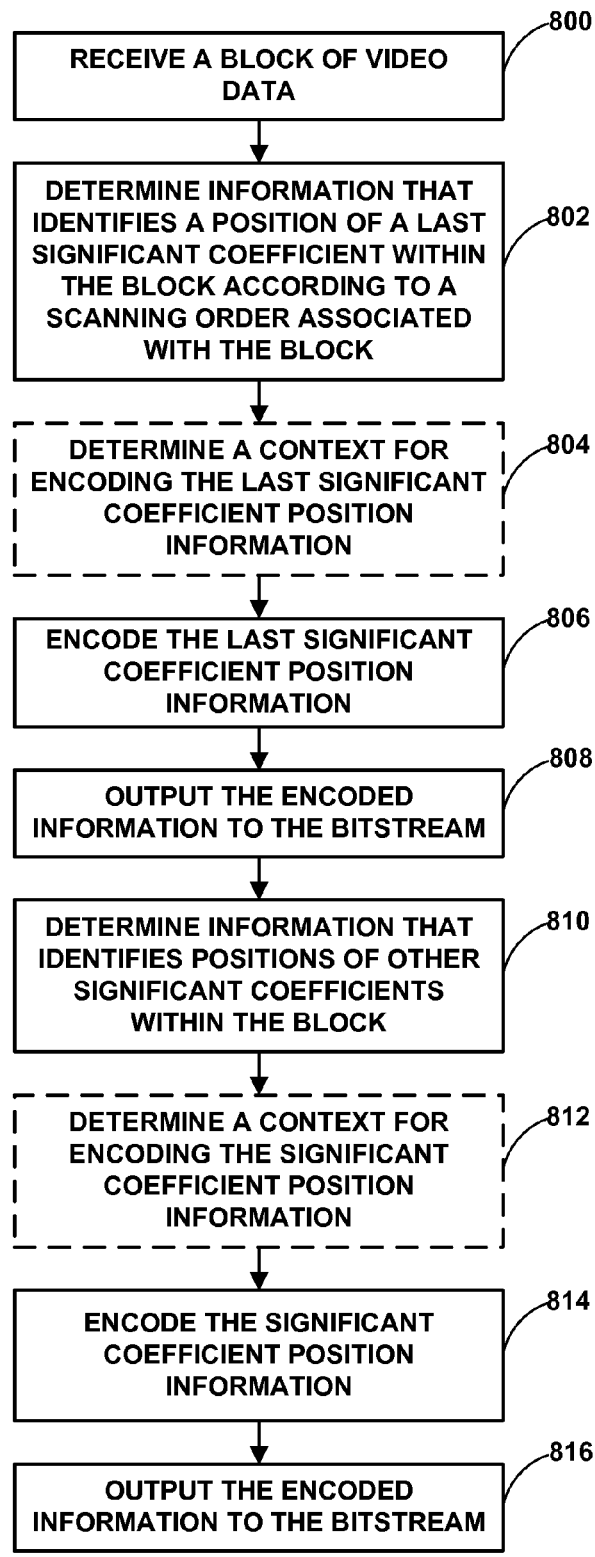
FIG. 8 is a flowchart that illustrates an example of a method for encoding last significant coefficient position information for a block of video data prior to encoding significant coefficient position information for the block.

FIG. 8 is a flowchart that illustrates an example of a method for encoding last significant coefficient position information for a block of video data prior to encoding significant coefficient position information for the block. Once again, the techniques of FIG. 8 may generally be performed by any processing unit or processor, whether implemented in hardware, software, firmware, or a combination thereof, and when implemented in software or firmware, corresponding hardware may be provided to execute instructions for the software or firmware. For purposes of example, the techniques of FIG. 8 are described with respect to entropy encoding unit 56 (FIG. 2), although it should be understood that other devices may be configured to perform similar techniques. Moreover, the steps illustrated in FIG. 8 may be performed in a different order or in parallel, and additional steps may be added and certain steps omitted, without departing from the techniques of this disclosure.

Initially, entropy encoding unit 56 may receive a block of video data (800). For example, the block may be a macroblock, or a TU of a CU. Entropy encoding unit 56 may further determine information that identifies a position of a last significant coefficient within the block according to a scanning order associated with the block (802), i.e., last significant coefficient position information for the block. As described above, the information may comprise a sequence of last significant coefficient flags, or horizontal and vertical coordinates of the last significant coefficient position within the block. Entropy encoding unit 56 may further determine a context for encoding the last significant coefficient position (804). For example, the encoding context may include the last significant coefficient position information itself. Entropy encoding unit 56 may further encode the last significant coefficient position information (806). For example, the information may be encoded by performing a context adaptive entropy coding process (e.g., a CABAC process) that includes applying a context model based on the determined context. Finally, entropy encoding unit 56 may output the encoded information to the bitstream (808).

Entropy encoding unit 56 may further determine information that identifies positions of other significant coefficients within the block (810), i.e., significant coefficient position information for the block. As described above, the significant coefficient position information may comprise a sequence of significant coefficient flags. Entropy encoding unit 56 may further determine a context for encoding the significant coefficient position information (812). For example, the encoding context may include the last significant coefficient position, and the significant coefficient position information itself. Entropy encoding unit 56 may further encode the significant coefficient position information (814). For example, the information may be encoded by performing a context adaptive entropy coding process (e.g., a CABAC process) that includes applying a context model based on the determined context. Finally, entropy encoding unit 56 may output the encoded information to the bitstream (816).

In this manner, the method of FIG. 8 represents an example of a method of coding information that identifies a position of a last significant coefficient within a block of video data according to a scanning order associated with the block prior to coding information that identifies positions of other significant coefficients within the block, wherein coding the information that identifies the position of the last significant coefficient within the block according to the scanning order includes at least one of the following: coding a one-dimensional position within the block that identifies the position of the last significant coefficient within the block according to the scanning order; coding a two-dimensional position within the block that identifies the position of the last significant coefficient within the block according to the scanning order; and coding a flag that indicates whether the last significant coefficient within the block according to the scanning order is located within a range of positions within the block, and coding the one-dimensional position within the block when the last significant coefficient within the block according to the scanning order is located within the range, and otherwise coding the two-dimensional position within the block.

Figure 9:
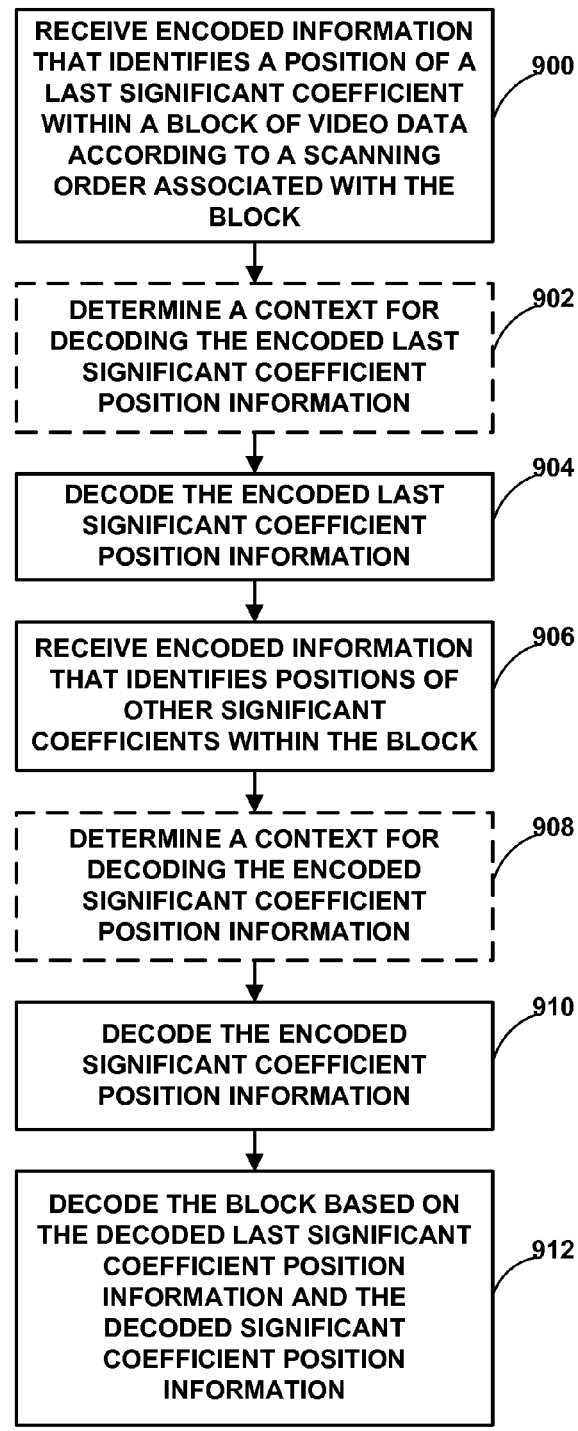
FIG. 9 is a flowchart that illustrates an example of a method for decoding encoded last significant coefficient position information for a block of video data prior to decoding encoded significant coefficient position information for the block.

FIG. 9 is a flowchart that illustrates an example of a method for decoding encoded last significant coefficient position information for a block of video data prior to decoding encoded significant coefficient position information for the block. Once again, the techniques of FIG. 9 may generally be performed by any processing unit or processor, whether implemented in hardware, software, firmware, or a combination thereof, and when implemented in software or firmware, corresponding hardware may be provided to execute instructions for the software or firmware. For purposes of example, the techniques of FIG. 9 are described with respect to entropy decoding unit 70 (FIG. 3), although it should be understood that other devices may be configured to perform similar techniques. Moreover, the steps illustrated in FIG. 9 may be performed in a different order or in parallel, and additional steps may be added and certain steps omitted, without departing from the techniques of this disclosure.

Initially, entropy decoding unit 70 may receive encoded information that identifies a position of a last significant coefficient within a block of video data according to a scanning order associated with the block (900), i.e., last significant coefficient position information for the block. Once again, the block may be a macroblock, or a TU of a CU. Entropy decoding unit 70 may further determine a context for decoding the encoded last significant coefficient position information (902). For example, the decoding context may include the last significant coefficient position information itself. Entropy decoding unit 70 may further decode the last significant coefficient position information (904). For example, the information may be decoded by performing a context adaptive entropy coding process (e.g., a CABAC process) that includes applying a context model based on the determined context. As described above, the decoded information may comprise a sequence of last significant coefficient flags, or horizontal and vertical coordinates of the last significant coefficient position within the block.

Subsequently, entropy decoding unit 70 may receive encoded information that identifies positions of other significant coefficients within a block (906), i.e., significant coefficient position information for the block. Entropy decoding unit 70 may further determine a context for decoding the encoded significant coefficient position information (908). For example, the decoding context may include the last significant coefficient position information, and the significant coefficient position information itself. Entropy decoding unit 70 may further decode the encoded significant coefficient position information (910). For example, the information may be decoded by performing a context adaptive entropy coding process (e.g., a CABAC process) that includes applying a context model based on the determined context. As described above, the decoded information may comprise a sequence of significant coefficient flags. Finally, entropy decoding unit 70 may decode the block based on the decoded last significant coefficient position information and the decoded significant coefficient information (912).

In this manner, the method of FIG. 9 represents an example of a method of coding information that identifies a position of a last significant coefficient within a block of video data according to a scanning order associated with the block prior to coding information that identifies positions of other significant coefficients within the block, wherein coding the information that identifies the position of the last significant coefficient within the block according to the scanning order includes at least one of the following: coding a one-dimensional position within the block that identifies the position of the last significant coefficient within the block according to the scanning order; coding a two-dimensional position within the block that identifies the position of the last significant coefficient within the block according to the scanning order; and coding a flag that indicates whether the last significant coefficient within the block according to the scanning order is located within a range of positions within the block, and coding the one-dimensional position within the block when the last significant coefficient within the block according to the scanning order is located within the range, and otherwise coding the two-dimensional position within the block.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A method of encoding coefficients associated with a block of video data during a video encoding process, the method comprising:

encoding information that identifies a position of a last non-zero coefficient within the block according to a scanning order associated with the block prior to encoding information that identifies positions of other non-zero coefficients within the block, wherein encoding the information that identifies the position of the last non-zero coefficient within the block according to the scanning order comprises encoding a two-dimensional position within the block that identifies the position of the last non-zero coefficient within the block according to the scanning order, and wherein encoding the two-dimensional position within the block that identifies the position of the last non-zero coefficient within the block according to the scanning order comprises:
  determining a horizontal coordinate of the position of the last non-zero coefficient within the block according to the scanning order and binarizing the horizontal coordinate, such that the horizontal coordinate comprises a first sequence of one or more bins;
  determining a vertical coordinate of the position of the last non-zero coefficient within the block according to the scanning order and binarizing the vertical coordinate, such that the vertical coordinate comprises a second sequence of one or more bins; and
  encoding the first sequence of one or more bins and encoding the second sequence of one or more bins by performing a context adaptive binary encoding process.

2. The method of claim 1, wherein the block comprises a first block and the scanning order comprises a first scanning order, the method further comprising:
  arranging coefficients associated with a second block of video data into a continuous sequence based on a second scanning order, wherein the second block is different than the first block, and wherein the second scanning order is different than the first scanning order; and
  mapping the continuous sequence into the first block using the first scanning order to generate the first block.

3. The method of claim 1, wherein the first sequence of one or more bins and the second sequence of one or more bins each comprise one of a unary codeword, a truncated unary codeword, an exponential Golomb codeword, or a concatenated codeword.

4. The method of claim 3, wherein the truncated unary codeword comprises:
  in the event the respective coordinate has a value that is less than a predetermined truncated value, a unary codeword comprising a variable number of a first symbol, the variable number corresponding to the value of the coordinate, followed by a second symbol, wherein the first symbol is different than the second symbol; and
  in the event the respective coordinate has a value that is greater than or equal to the truncated value, a predetermined number of the first symbol, the predetermined number corresponding to the truncated value.

5. The method of claim 3, wherein the concatenated codeword comprises a concatenation of a first codeword and a second codeword, wherein the first codeword is different than the second codeword.

6. The method of claim 1, wherein performing the context adaptive binary arithmetic encoding process includes applying at least one context model based on at least one context, wherein the at least one context includes a position of the respective bin within the sequence.

7. The method of claim 1, wherein encoding the horizontal coordinate and the vertical coordinate comprises encoding at least one bin of the first sequence of one or more bins based at least in part on a value of at least one bin of the second sequence of one or more bins.

8. The method of claim 7, wherein encoding the at least one bin of the first sequence based at least in part on the value of the at least one bin of the second sequence comprises applying at least one context model based on at least one context, wherein the at least one context includes the value of the at least one bin of the second sequence.

9. The method of claim 1, wherein encoding the horizontal coordinate and the vertical coordinate comprises encoding the first sequence of one or more bins and the second sequence of one or more bins in an interleaved manner.

10. The method of claim 9, wherein encoding in the interleaved manner comprises:
encoding one or more first bins of the first sequence using a regular coding mode prior to encoding one or more second bins of the second sequence using the regular coding mode, followed by encoding one or more third bins of the first sequence using the bypass coding mode prior to encoding one or more fourth bins of the second sequence using the bypass coding mode.

11. The method of claim 1, wherein the scanning order comprises a first scanning order, and wherein encoding the information that identifies the positions of the other non-zero coefficients within the block comprises:
for each of one or more coefficients associated with the block, starting with the last non-zero coefficient within the block according to the first scanning order and ending with a first coefficient within the block according to the first scanning order, and proceeding according to a second scanning order that is reversed relative to the first scanning order, determining whether the coefficient is a non-zero coefficient, and generating a significant coefficient flag that indicates whether the coefficient is a non-zero coefficient;
arranging the significant coefficient flags for the one or more coefficients into a continuous sequence based on the second scanning order; and
encoding the continuous sequence.

12. The method of claim 1, wherein encoding the information that identifies the positions of the other non-zero coefficients within the block comprises:
arranging one or more coefficients associated with the block, starting with a first coefficient within the block according to the scanning order and ending with the last non-zero coefficient within the block according to the scanning order, and proceeding according to the scanning order, into one or more groups, wherein each of the one or more groups comprises one or more of the coefficients;
for each of the one or more groups, determining whether the one or more of the coefficients are non-zero coefficients, and generating one or more flags, wherein the one or more flags include a group flag that indicates whether the one or more of the coefficients are all zero-valued coefficients, and, when at least one of the one or more of the coefficients is a non-zero coefficient, the one or more flags further include a significant coefficient flag for each of the one or more of the coefficients that indicates whether the respective coefficient is a non-zero coefficient;
arranging the one or more flags for the one or more groups into a continuous sequence based on the scanning order; and
encoding the continuous sequence.

13. A method of decoding coefficients associated with a block of video data during a video decoding process, the method comprising:
decoding information that identifies a position of a last non-zero coefficient within the block according to a scanning order associated with the block prior to decoding information that identifies positions of other non-zero coefficients within the block, wherein decoding the information that identifies the position of the last non-zero coefficient within the block according to the scanning order comprises decoding a two-dimensional position within the block that identifies the position of the last non-zero coefficient within the block according to the scanning order,
and wherein decoding the two-dimensional position within the block that identifies the position of the last non-zero coefficient within the block according to the scanning order comprises:
decoding a horizontal coordinate of the position of the last non-zero coefficient within the block according to the scanning order including decoding a first sequence of one or more bins associated with the horizontal component using a context adaptive binary decoding process;
decoding a vertical coordinate of the position of the last non-zero coefficient within the block according to the scanning order including decoding a second sequence of bins one or more bins associated with the vertical component using the context adaptive binary decoding process; and
for each coefficient associated with the block, determining whether the coefficient is the last non-zero coefficient within the block according to the scanning order, based on the horizontal coordinate and the vertical coordinate.

14. The method of claim 13, wherein the block comprises a first block and the scanning order comprises a first scanning order, the method further comprising:
arranging the coefficients associated with the first block into a continuous sequence based on the first scanning order;
mapping the continuous sequence into a second block of video data using a second scanning order, wherein the second block is different than the first block, and wherein the second scanning order is different than the first scanning order, to generate the second block; and
for each coefficient associated with the second block, determining whether the coefficient is the last non-zero coefficient within the second block according to the second scanning order, based on the determinations for the first block.

15. The method of claim 13, wherein the first sequence of one or more bins and the second sequence of one or more bins each comprise one of a unary codeword, a truncated unary codeword, an exponential Golomb codeword, or a concatenated codeword.

16. The method of claim 15, wherein the truncated unary codeword comprises:
in the event the respective coordinate has a value that is less than a predetermined truncated value, a unary codeword comprising a variable number of a first symbol, the variable number corresponding to the value of the coordinate, followed by a second symbol, wherein the first symbol is different than the second symbol; and
in the event respective the coordinate has a value that is greater than or equal to the truncated value, a predetermined number of the first symbol, the predetermined number corresponding to the truncated value.

17. The method of claim 15, wherein the concatenated codeword comprises a concatenation of a first codeword and a second codeword, wherein the first codeword is different than the second codeword.

18. The method of claim 13, wherein performing the context adaptive binary arithmetic decoding process includes applying at least one context model based on at least one context, wherein the at least one context includes a position of the respective bin within the sequence.

19. The method of claim 13, wherein decoding the horizontal coordinate and the vertical coordinate comprises decoding at least one bin of the first sequence of one or more bins based at least in part on a value of at least one bin of the second sequence of one or more bins.

20. The method of claim 19, wherein decoding the at least one bin of the first sequence based at least in part on the value of the at least one bin of the second sequence comprises applying at least one context model based on at least one context, wherein the at least one context includes the value of the at least one bin of the second sequence.

21. The method of claim 13, wherein decoding the horizontal coordinate and the vertical coordinate comprises decoding the first sequence of one or more bins and the second sequence of one or more bins in an interleaved manner.

22. The method of claim 21, wherein decoding in the interleaved manner comprises:
decoding one or more bins of the first sequence using a regular coding mode prior to decoding one or more second bins of the second sequence using the regular coding mode, followed by decoding one or more third bins of the first sequence using the bypass coding mode prior to decoding one or more fourth bins of the second sequence using the bypass coding mode.

23. The method of claim 13, wherein the scanning order comprises a first scanning order, and wherein decoding the information that identifies the positions of the other non-zero coefficients within the block comprises:
decoding a continuous sequence of significant coefficient flags for one or more coefficients associated with the block, starting with the last non-zero coefficient within the block according to the first scanning order and ending with a first coefficient within the block according to the first scanning order, and proceeding according to a second scanning order that is reversed relative to the first scanning order, wherein each of the significant coefficient flags indicates whether the respective coefficient is a non-zero coefficient; and
for each coefficient associated with the block, determining whether the coefficient is a non-zero coefficient, based on the continuous sequence.

24. The method of claim 13, wherein decoding the information that identifies the positions of the other non-zero coefficients within the block comprises:
decoding a continuous sequence of flags for one or more coefficients associated with the block arranged into one or more groups, starting with a first coefficient within the block according to the scanning order and ending with the last non-zero coefficient within the block according to the scanning order, and proceeding according to the scanning order, wherein each of the one or more groups comprises one or more of the coefficients,
wherein for each of the one or more groups, the continuous sequence comprises one or more flags, wherein the one or more flags include a group flag that indicates whether the one or more of the coefficients are all zero-valued coefficients, and, when at least one of the one or more of the coefficients is a non-zero coefficient, the one or more flags further include a significant coefficient flag for each of the one or more of the coefficients that indicates whether the respective coefficient is a non-zero coefficient; and
for each coefficient associated with the block, determining whether the coefficient is a non-zero coefficient, based on the continuous sequence.

25. An apparatus for encoding coefficients associated with a block of video data during a video encoding process, the apparatus comprising:
a memory configured to store the block of video data; and
a video encoder configured to:
encode information that identifies a position of a last non-zero coefficient within the block according to a scanning order associated with the block prior to encoding information that identifies positions of other non-zero coefficients within the block, wherein to encode the information that identifies the position of the last non-zero coefficient within the block according to the scanning order, the video encoder is configured to encode a two-dimensional position within the block that identifies the position of the last non-zero coefficient within the block according to the scanning order, and wherein to encode the two-dimensional position within the block that identifies the position of the last non-zero coefficient within the block according to the scanning order, the video encoder is configured to:
determine a horizontal coordinate of the position of the last non-zero coefficient within the block according to the scanning order and binarize the horizontal coordinate, such that the horizontal coordinate comprises a first sequence of one or more bins;
determine a vertical coordinate of the position of the last non-zero coefficient within the block according to the scanning order and binarize the vertical coordinate, such that the vertical coordinate comprises a second sequence of one or more bins; and
encode the first sequence of one or more bins and encoding the second sequence of one or more bins by performing a context adaptive binary encoding process.

26. The apparatus of claim 25, wherein the block comprises a first block and the scanning order comprises a first scanning order, and wherein the video encoder is further configured to:
arrange coefficients associated with a second block of video data into a continuous sequence based on a second scanning order, wherein the second block is different than the first block, and wherein the second scanning order is different than the first scanning order; and
map the continuous sequence into the first block using the first scanning order to generate the first block.

27. The apparatus of claim 25, wherein to encode the horizontal coordinate and the vertical coordinate, the entropy encoding unit is configured to encode at least one bin of the first sequence of one or more bins based at least in part on a value of at least one bin of the second sequence of one or more bins.

28. The apparatus of claim 27, wherein to encode the at least one bin of the first sequence based at least in part on the value of the at least one bin of the second sequence, the video encoder is configured to apply at least one context model based on at least one context, wherein the at least one context includes the value of the at least one bin of the second sequence.

29. The apparatus of claim 25, wherein to encode the horizontal coordinate and the vertical coordinate, the video encoder is configured to encode the first sequence of one or more bins and the second sequence of one or more bins in an interleaved manner.

30. The apparatus of claim 25, wherein the scanning order comprises a first scanning order, and wherein to encode the information that identifies the positions of the other non-zero coefficients within the block, the video encoder is configured to:
for each of one or more coefficients associated with the block, starting with the last non-zero coefficient within the block according to the first scanning order and ending with a first coefficient within the block according to the first scanning order, and proceeding according to a second scanning order that is reversed relative to the first scanning order, determine whether the coefficient is a non-zero coefficient, and generate a significant coefficient flag that indicates whether the coefficient is a non-zero coefficient;
arrange the significant coefficient flags for the one or more coefficients into a continuous sequence based on the second scanning order; and
encode the continuous sequence.

31. The apparatus of claim 25, wherein to encode the information that identifies the positions of the other non-zero coefficients within the block, the video encoder is configured to:
arrange one or more coefficients associated with the block, starting with a first coefficient within the block according to the scanning order and ending with the last non-zero coefficient within the block according to the scanning order, and proceeding according to the scanning order, into one or more groups, wherein each of the one or more groups comprises one or more of the coefficients;
for each of the one or more groups, determine whether the one or more of the coefficients are non-zero coefficients, and generate one or more flags, wherein the one or more flags include a group flag that indicates whether the one or more of the coefficients are all zero-valued coefficients, and, when at least one of the one or more of the coefficients is a non-zero coefficient, the one or more flags further include a significant coefficient flag for each of the one or more of the coefficients that indicates whether the respective coefficient is a non-zero coefficient;
arrange the one or more flags for the one or more groups into a continuous sequence based on the scanning order; and
encode the continuous sequence.

32. The apparatus of claim 25, wherein the first sequence of one or more bins and the second sequence of one or more bins each comprise one of a unary codeword, a truncated unary codeword, an exponential Golomb codeword, or a concatenated codeword.

33. The apparatus of claim 32, wherein the truncated unary codeword comprises:
in the event the respective coordinate has a value that is less than a predetermined truncated value, a unary codeword comprising a variable number of a first symbol, the variable number corresponding to the value of the coordinate, followed by a second symbol, wherein the first symbol is different than the second symbol; and
in the event the respective coordinate has a value that is greater than or equal to the truncated value, a predetermined number of the first symbol, the predetermined number corresponding to the truncated value.

34. The apparatus of claim 32, wherein the concatenated codeword comprises a concatenation of a first codeword and a second codeword, wherein the first codeword is different than the second codeword.

35. An apparatus for decoding coefficients associated with a block of video data during a video decoding process, the apparatus comprising:
a memory configured to store the block of video data; and
a video decoder configured to:
decode information that identifies a position of a last non-zero coefficient within the block according to a scanning order associated with the block prior to decoding information that identifies positions of other non-zero coefficients within the block, wherein to decode the information that identifies the position of the last non-zero coefficient within the block according to the scanning order, the video decoder is configured to decode a two-dimensional position within the block that identifies the position of the last non-zero coefficient within the block according to the scanning order, and wherein to decode the two-dimensional position within the block that identifies the position of the last non-zero coefficient within the block according to the scanning order, the video decoder is configured to:
decode a horizontal coordinate of the position of the last non-zero coefficient within the block according to the scanning order including decoding a first sequence of one or more bins associated with the horizontal component using a context adaptive binary decoding process;
decode a vertical coordinate of the position of the last non-zero coefficient within the block according to the scanning order including decoding a second sequence of bins one or more bins associated with the vertical component using the context adaptive binary decoding process; and
for each coefficient associated with the block, determine whether the coefficient is the last non-zero coefficient within the block according to the scanning order, based on the horizontal coordinate and the vertical coordinate.

36. The apparatus of claim 35, wherein the block comprises a first block and the scanning order comprises a first scanning order, and wherein the video decoder is further configured to:
arrange the coefficients associated with the first block into a continuous sequence based on the first scanning order;
map the continuous sequence into a second block of video data using a second scanning order, wherein the second block is different than the first block, and wherein the second scanning order is different than the first scanning order, to generate the second block; and
for each coefficient associated with the second block, determine whether the coefficient is the last non-zero coefficient within the second block according to the second scanning order, based on the determinations for the first block.

37. The apparatus of claim 35, wherein to decode the horizontal coordinate and the vertical coordinate, the video decoder is configured to decode at least one bin of the first sequence of one or more bins based at least in part on a value of at least one bin of the second sequence of one or more bins.

38. The apparatus of claim 37, wherein to decode the at least one bin of the first sequence based at least in part on the value of the at least one bin of the second sequence, the video decoder is configured to apply at least one context model based on at least one context, wherein the at least one context includes the value of the at least one bin of the second sequence.

39. The apparatus of claim 35, wherein to decode the horizontal coordinate and the vertical coordinate, the video decoder is configured to decode the first sequence of one or more bins and the second sequence of one or more bins in an interleaved manner.

40. The apparatus of claim 35, wherein the scanning order comprises a first scanning order, and wherein to decode the information that identifies the positions of the other non-zero coefficients within the block, the video decoder is configured to:
  decode a continuous sequence of significant coefficient flags for one or more coefficients associated with the block, starting with the last non-zero coefficient within the block according to the first scanning order and ending with a first coefficient within the block according to the first scanning order, and proceeding according to a second scanning order that is reversed relative to the first scanning order, wherein each of the significant coefficient flags indicates whether the respective coefficient is a non-zero coefficient; and
  for each coefficient associated with the block, determine whether the coefficient is a non-zero coefficient, based on the continuous sequence.

41. The apparatus of claim 35, wherein to decode the information that identifies the positions of the other non-zero coefficients within the block, the video decoder is configured to:
  decode a continuous sequence of flags for one or more coefficients associated with the block arranged into one or more groups, starting with a first coefficient within the block according to the scanning order and ending with the last non-zero coefficient within the block according to the scanning order, and proceeding according to the scanning order, wherein each of the one or more groups comprises one or more of the coefficients, wherein for each of the one or more groups, the continuous sequence comprises one or more flags, wherein the one or more flags include a group flag that indicates whether the one or more of the coefficients are all zero-valued coefficients, and, when at least one of the one or more of the coefficients is a non-zero coefficient, the one or more flags further include a significant coefficient flag for each of the one or more of the coefficients that indicates whether the respective coefficient is a non-zero coefficient; and
  for each coefficient associated with the block, determine whether the coefficient is a non-zero coefficient, based on the continuous sequence.

42. The apparatus of claim 35, wherein the apparatus comprises at least one of:
  an integrated circuit;
  a microprocessor; or
  a wireless communication device that includes the video coder.

43. The apparatus of claim 35, wherein the first sequence of one or more bins and the second sequence of one or more bins each comprise one of a unary codeword, a truncated unary codeword, an exponential Golomb codeword, or a concatenated codeword.

44. The apparatus of claim 43, wherein the truncated unary codeword comprises:
  in the event the respective coordinate has a value that is less than a predetermined truncated value, a unary codeword comprising a variable number of a first symbol, the variable number corresponding to the value of the coordinate, followed by a second symbol, wherein the first symbol is different than the second symbol; and
  in the event the respective coordinate has a value that is greater than or equal to the truncated value, a predetermined number of the first symbol, the predetermined number corresponding to the truncated value.

45. The apparatus of claim 43, wherein the concatenated codeword comprises a concatenation of a first codeword and a second codeword, wherein the first codeword is different than the second codeword.

46. A device for encoding coefficients associated with a block of video data during a video encoding process, the device comprising:
  means for encoding information that identifies a position of a last non-zero coefficient within the block according to a scanning order associated with the block prior to coding information that identifies positions of other non-zero coefficients within the block; and
  means for encoding the information that identifies the positions of the other non-zero coefficients within the block,
  wherein the means for encoding the information that identifies the position of the last non-zero coefficient within the block according to the scanning order comprises means for encoding a two-dimensional position within the block that identifies the position of the last non-zero coefficient within the block according to the scanning order, and wherein the means for encoding the two-dimensional position within the block that identifies the position of the last non-zero coefficient within the block according to the scanning order comprises:
    means for determining a horizontal coordinate of the position of the last non-zero coefficient within the block according to the scanning order and binarizing the horizontal coordinate, such that the horizontal coordinate comprises a first sequence of one or more bins;
    means for determining a vertical coordinate of the position of the last non-zero coefficient within the block according to the scanning order and binarizing the vertical coordinate, such that the vertical coordinate comprises a second sequence of one or more bins; and
    means for encoding the first sequence of one or more bins and encoding the second sequence of one or more bins by performing a context adaptive binary encoding process.

47. The device of claim 46, wherein the block comprises a first block and the scanning order comprises a first scanning order, the device further comprising:
  means for arranging coefficients associated with a second block of video data into a continuous sequence based on a second scanning order, wherein the second block is different than the first block, and wherein the second scanning order is different than the first scanning order; and
  means for mapping the continuous sequence into the first block using the first scanning order to generate the first block.

48. The device of claim 46, wherein the means for encoding the horizontal coordinate and the vertical coordinate comprises means for encoding at least one bin of the first sequence of one or more bins based at least in part on a value of at least one bin of the second sequence of one or more bins.

49. The device of claim 48, wherein the means for encoding the at least one bin of the first sequence based at least in part on the value of the at least one bin of the second sequence comprises means for applying at least one context model based on at least one context, wherein the at least one context includes the value of the at least one bin of the second sequence.

50. The device of claim 46, wherein the means for encoding the horizontal coordinate and the vertical coordinate comprises means for encoding the first sequence of one or more bins and the second sequence of one or more bins in an interleaved manner.

51. The device of claim 46, wherein the scanning order comprises a first scanning order, and wherein the means for encoding the information that identifies the positions of the other non-zero coefficients within the block comprises:
   means for, for each of one or more coefficients associated with the block, starting with the last non-zero coefficient within the block according to the first scanning order and ending with a first coefficient within the block according to the first scanning order, and proceeding according to a second scanning order that is reversed relative to the first scanning order, determining whether the coefficient is a non-zero coefficient, and generating a significant coefficient flag that indicates whether the coefficient is a non-zero coefficient;
   means for arranging the significant coefficient flags for the one or more coefficients into a continuous sequence based on the second scanning order; and
   means for encoding the continuous sequence.

52. The device of claim 46, wherein the means for encoding the information that identifies the positions of the other non-zero coefficients within the block comprises:
   means for arranging one or more coefficients associated with the block, starting with a first coefficient within the block according to the scanning order and ending with the last non-zero coefficient within the block according to the scanning order, and proceeding according to the scanning order, into one or more groups, wherein each of the one or more groups comprises one or more of the coefficients;
   means for, for each of the one or more groups, determining whether the one or more of the coefficients are non-zero coefficients, and generating one or more flags, wherein the one or more flags include a group flag that indicates whether the one or more of the coefficients are all zero-valued coefficients, and, when at least one of the one or more of the coefficients is a non-zero coefficient, the one or more flags further include a significant coefficient flag for each of the one or more of the coefficients that indicates whether the respective coefficient is a non-zero coefficient;
   means for arranging the one or more flags for the one or more groups into a continuous sequence based on the scanning order; and
   means for encoding the continuous sequence.

53. The device of claim 46, wherein the first sequence of one or more bins and the second sequence of one or more bins each comprise one of a unary codeword, a truncated unary codeword, an exponential Golomb codeword, or a concatenated codeword.

54. The apparatus of claim 53, wherein the truncated unary codeword comprises:
   in the event the respective coordinate has a value that is less than a predetermined truncated value, a unary codeword comprising a variable number of a first symbol, the variable number corresponding to the value of the coordinate, followed by a second symbol, wherein the first symbol is different than the second symbol; and
   in the event the respective coordinate has a value that is greater than or equal to the truncated value, a predetermined number of the first symbol, the predetermined number corresponding to the truncated value.

55. The apparatus of claim 53, wherein the concatenated codeword comprises a concatenation of a first codeword and a second codeword, wherein the first codeword is different than the second codeword.

56. A device for decoding coefficients associated with a block of video data during a video decoding process, the device comprising:
   means for decoding information that identifies a position of a last non-zero coefficient within the block according to a scanning order associated with the block prior to coding information that identifies positions of other non-zero coefficients within the block; and
   means for decoding the information that identifies the positions of the other non-zero coefficients within the block,
   wherein the means for decoding the information that identifies the position of the last non-zero coefficient within the block according to the scanning order comprises means for decoding a two-dimensional position within the block that identifies the position of the last non-zero coefficient within the block according to the scanning order, and wherein the means for decoding the two-dimensional position within the block comprises:
      means for decoding a horizontal coordinate of the position of the last non-zero coefficient within the block according to the scanning order including means for decoding a first sequence of one or more bins associated with the horizontal component using a context adaptive binary decoding process;
      means for decoding a vertical coordinate of the position of the last non-zero coefficient within the block according to the scanning order including means for decoding a second sequence of bins one or more bins associated with the vertical component using the context adaptive binary decoding process; and
      means for, for each coefficient associated with the block, determining whether the coefficient is the last non-zero coefficient within the block according to the scanning order, based on the horizontal coordinate and the vertical coordinate.

57. The device of claim 56, wherein the block comprises a first block and the scanning order comprises a first scanning order, and wherein the device further comprises:
   means for arranging the coefficients associated with the first block into a continuous sequence based on the first scanning order;
   means for mapping the continuous sequence into a second block of video data using a second scanning order, wherein the second block is different than the first block, and wherein the second scanning order is different than the first scanning order, to generate the second block; and
   means for, for each coefficient associated with the second block, determining whether the coefficient is the last non-zero coefficient within the second block according to the second scanning order, based on the determinations for the first block.

58. The device of claim 56, wherein the means for decoding the horizontal coordinate and the vertical coordinate comprises means for decoding at least one bin of the first sequence of one or more bins based at least in part on a value of at least one bin of the second sequence of one or more bins.

59. The device of claim 58, wherein the means for decoding the at least one bin of the first sequence based at least in part on the value of the at least one bin of the second sequence comprises means for applying at least one context model based on at least one context, wherein the at least one context includes the value of the at least one bin of the second sequence.

60. The device of claim 56, wherein the means for decoding the horizontal coordinate and the vertical coordinate comprises means for decoding the first sequence of one or more bins and the second sequence of one or more bins in an interleaved manner.

61. The device of claim 56, wherein the scanning order comprises a first scanning order, and wherein the means for decoding the information that identifies the positions of the other non-zero coefficients within the block comprises:
  means for decoding a continuous sequence of significant coefficient flags for one or more coefficients associated with the block, starting with the last non-zero coefficient within the block according to the first scanning order and ending with a first coefficient within the block according to the first scanning order, and proceeding according to a second scanning order that is reversed relative to the first scanning order, wherein each of the significant coefficient flags indicates whether the respective coefficient is a non-zero coefficient; and
  means for, for each coefficient associated with the block, determining whether the coefficient is a non-zero coefficient, based on the continuous sequence.

62. The device of claim 56, wherein the means for decoding the information that identifies the positions of the other non-zero coefficients within the block comprises:
  means for decoding a continuous sequence of flags for one or more coefficients associated with the block arranged into one or more groups, starting with a first coefficient within the block according to the scanning order and ending with the last non-zero coefficient within the block according to the scanning order, and proceeding according to the scanning order, wherein each of the one or more groups comprises one or more of the coefficients, wherein for each of the one or more groups, the continuous sequence comprises one or more flags, wherein the one or more flags include a group flag that indicates whether the one or more of the coefficients are all zero-valued coefficients, and, when at least one of the one or more of the coefficients is a non-zero coefficient, the one or more flags further include a significant coefficient flag for each of the one or more of the coefficients that indicates whether the respective coefficient is a non-zero coefficient; and
  means for, for each coefficient associated with the block, determining whether the coefficient is a non-zero coefficient, based on the continuous sequence.

63. The apparatus of claim 56, wherein the first sequence of one or more bins and the second sequence of one or more bins each comprise one of a unary codeword, a truncated unary codeword, an exponential Golomb codeword, or a concatenated codeword.

64. The apparatus of claim 63, wherein the truncated unary codeword comprises:
  in the event the respective coordinate has a value that is less than a predetermined truncated value, a unary codeword comprising a variable number of a first symbol, the variable number corresponding to the value of the coordinate, followed by a second symbol, wherein the first symbol is different than the second symbol; and
  in the event the respective coordinate has a value that is greater than or equal to the truncated value, a predetermined number of the first symbol, the predetermined number corresponding to the truncated value.

65. The apparatus of claim 63, wherein the concatenated codeword comprises a concatenation of a first codeword and a second codeword, wherein the first codeword is different than the second codeword.

66. A non-transitory computer-readable medium comprising instructions that, when executed, cause a processor to encode coefficients associated with a block of video data during a video encoding process, wherein the instructions cause the processor to:
  encode information that identifies a position of a last non-zero coefficient within the block according to a scanning order associated with the block prior to coding information that identifies positions of other non-zero coefficients within the block, wherein the instructions that cause the processor to encode the information that identifies the position of the last non-zero coefficient within the block according to the scanning order comprise instructions that cause the processor to encode a two-dimensional position within the block that identifies the position of the last non-zero coefficient within the block according to the scanning order, and wherein to encode the two-dimensional position within the block that identifies the position of the last non-zero coefficient within the block according to the scanning order, the instructions cause the processor to:
    determine a horizontal coordinate of the position of the last non-zero coefficient within the block according to the scanning order and binarize the horizontal coordinate, such that the horizontal coordinate comprises a first sequence of one or more bins;
    determine a vertical coordinate of the position of the last non-zero coefficient within the block according to the scanning order and binarize the vertical coordinate, such that the vertical coordinate comprises a second sequence of one or more bins; and
    encode the first sequence of one or more bins and encode the second sequence of one or more bins by performing a context adaptive binary encoding process.

67. The non-transitory computer-readable medium of claim 66, wherein the block comprises a first block and the scanning order comprises a first scanning order, further comprising instructions that cause the processor to:
  arrange coefficients associated with a second block of video data into a continuous sequence based on a second scanning order, wherein the second block is different than the first block, and wherein the second scanning order is different than the first scanning order; and
  map the continuous sequence into the first block using the first scanning order to generate the first block.

68. The non-transitory computer-readable medium of claim 66, wherein the instructions that cause the processor to encode the horizontal coordinate and the vertical coordinate comprise instructions that cause the processor to encode at least one bin of the first sequence of one or more bins based at least in part on a value of at least one bin of the second sequence of one or more bins.

69. The non-transitory computer-readable medium of claim 68, wherein the instructions that cause the processor to encode the at least one bin of the first sequence based at least in part on the value of the at least one bin of the second sequence comprise instructions that cause the processor to apply at least one context model based on at least one context, wherein the at least one context includes the value of the at least one bin of the second sequence.

70. The non-transitory computer-readable medium of claim 66, wherein the instructions that cause the processor to encode the horizontal coordinate and the vertical coordinate comprise instructions that cause the processor to encode the first sequence of one or more bins and the second sequence of one or more bins in an interleaved manner.

71. The non-transitory computer-readable medium of claim 66, wherein the scanning order comprises a first scanning order, and wherein the instructions further cause the processor to:
for each of one or more coefficients associated with the block, starting with the last non-zero coefficient within the block according to the first scanning order and ending with a first coefficient within the block according to the first scanning order, and proceeding according to a second scanning order that is reversed relative to the first scanning order, determine whether the coefficient is a non-zero coefficient, and generate a significant coefficient flag that indicates whether the coefficient is a non-zero coefficient;
arrange the significant coefficient flags for the one or more coefficients into a continuous sequence based on the second scanning order; and
encode the continuous sequence.

72. The non-transitory computer-readable medium of claim 66, wherein the instructions further cause the processor to:
arrange one or more coefficients associated with the block, starting with a first coefficient within the block according to the scanning order and ending with the last non-zero coefficient within the block according to the scanning order, and proceeding according to the scanning order, into one or more groups, wherein each of the one or more groups comprises one or more of the coefficients;
for each of the one or more groups, determine whether the one or more of the coefficients are non-zero coefficients, and generate one or more flags, wherein the one or more flags include a group flag that indicates whether the one or more of the coefficients are all zero-valued coefficients, and, when at least one of the one or more of the coefficients is a non-zero coefficient, the one or more flags further include a significant coefficient flag for each of the one or more of the coefficients that indicates whether the respective coefficient is a non-zero coefficient;
arrange the one or more flags for the one or more groups into a continuous sequence based on the scanning order; and
encode the continuous sequence.

73. The non-transitory computer-readable medium of claim 66, wherein the first sequence of one or more bins and the second sequence of one or more bins each comprise one of a unary codeword, a truncated unary codeword, an exponential Golomb codeword, or a concatenated codeword.

74. The non-transitory computer-readable medium of claim 73, wherein the truncated unary codeword comprises:
in the event the respective coordinate has a value that is less than a predetermined truncated value, a unary codeword comprising a variable number of a first symbol, the variable number corresponding to the value of the coordinate, followed by a second symbol, wherein the first symbol is different than the second symbol; and
in the event the respective coordinate has a value that is greater than or equal to the truncated value, a predetermined number of the first symbol, the predetermined number corresponding to the truncated value.

75. The non-transitory computer-readable medium of claim 73, wherein the concatenated codeword comprises a concatenation of a first codeword and a second codeword, wherein the first codeword is different than the second codeword.

76. A non-transitory computer-readable medium comprising instructions that, when executed, cause a processor to decode coefficients associated with a block of video data during a video decoding process, wherein the instructions cause the processor to:
decode information that identifies a position of a last non-zero coefficient within the block according to a scanning order associated with the block prior to coding information that identifies positions of other non-zero coefficients within the block, wherein the instructions that cause the processor to decode the information that identifies the position of the last non-zero coefficient within the block according to the scanning order comprise instructions that cause the processor to decode a two-dimensional position within the block that identifies the position of the last non-zero coefficient within the block according to the scanning order,
and wherein the instructions that cause the processor to decode the two-dimensional position within the block that identifies the position of the last non-zero coefficient within the block according to the scanning order comprise instructions that cause the processor to:
decode a horizontal coordinate of the position of the last non-zero coefficient within the block according to the scanning order including decoding a first sequence of one or more bins associated with the horizontal component using a context adaptive binary decoding process;
decode a vertical coordinate of the position of the last non-zero coefficient within the block according to the scanning order including decoding a second sequence of bins one or more bins associated with the vertical component using the context adaptive binary decoding process; and
for each coefficient associated with the block, determine whether the coefficient is the last non-zero coefficient within the block according to the scanning order, based on the horizontal coordinate and the vertical coordinate.

77. The non-transitory computer-readable medium of claim 76, wherein the block comprises a first block and the scanning order comprises a first scanning order, further comprising instructions that cause the processor to:
arrange the coefficients associated with the first block into a continuous sequence based on the first scanning order;
map the continuous sequence into a second block of video data using a second scanning order, wherein the second block is different than the first block, and wherein the second scanning order is different than the first scanning order, to generate the second block; and
for each coefficient associated with the second block, determine whether the coefficient is the last non-zero coefficient within the second block according to the second scanning order, based on the determinations for the first block.

78. The non-transitory computer-readable medium of claim 76, wherein the instructions that cause the processor to decode the horizontal coordinate and the vertical coordinate comprise instructions that cause the processor to decode at least one bin of the first sequence of one or more bins based at least in part on a value of at least one bin of the second sequence of one or more bins.

79. The non-transitory computer-readable medium of claim 78, wherein the instructions that cause the processor to decode the at least one bin of the first sequence based at least in part on the value of the at least one bin of the second sequence comprise instructions that cause the processor to apply at least one context model based on at least one context, wherein the at least one context includes the value of the at least one bin of the second sequence.

80. The non-transitory computer-readable medium of claim 76, wherein the instructions that cause the processor to decode the horizontal coordinate and the vertical coordinate comprise instructions that cause the processor to decode the first sequence of one or more bins and the second sequence of one or more bins in an interleaved manner.

81. The non-transitory computer-readable medium of claim 76, wherein the scanning order comprises a first scanning order, and wherein the instructions further cause the processor to:
  decode a continuous sequence of significant coefficient flags for one or more coefficients associated with the block, starting with the last non-zero coefficient within the block according to the first scanning order and ending with a first coefficient within the block according to the first scanning order, and proceeding according to a second scanning order that is reversed relative to the first scanning order, wherein each of the significant coefficient flags indicates whether the respective coefficient is a non-zero coefficient; and
  for each coefficient associated with the block, determine whether the coefficient is a non-zero coefficient, based on the continuous sequence.

82. The non-transitory computer-readable medium of claim 76, wherein the instructions further cause the processor to:
  decode a continuous sequence of flags for one or more coefficients associated with the block arranged into one or more groups, starting with a first coefficient within the block according to the scanning order and ending with the last non-zero coefficient within the block according to the scanning order, and proceeding according to the scanning order, wherein each of the one or more groups comprises one or more of the coefficients, wherein for each of the one or more groups, the continuous sequence comprises one or more flags, wherein the one or more flags include a group flag that indicates whether the one or more of the coefficients are all zero-valued coefficients, and, when at least one of the one or more of the coefficients is a non-zero coefficient, the one or more flags further include a significant coefficient flag for each of the one or more of the coefficients that indicates whether the respective coefficient is a non-zero coefficient; and
  for each coefficient associated with the block, determine whether the coefficient is a non-zero coefficient, based on the continuous sequence.

83. The non-transitory computer-readable medium of claim 76, wherein the first sequence of one or more bins and the second sequence of one or more bins each comprise one of a unary codeword, a truncated unary codeword, an exponential Golomb codeword, or a concatenated codeword.

84. The non-transitory computer-readable medium of claim 83, wherein the truncated unary codeword comprises:
  in the event the respective coordinate has a value that is less than a predetermined truncated value, a unary codeword comprising a variable number of a first symbol, the variable number corresponding to the value of the coordinate, followed by a second symbol, wherein the first symbol is different than the second symbol; and
  in the event the respective coordinate has a value that is greater than or equal to the truncated value, a predetermined number of the first symbol, the predetermined number corresponding to the truncated value.

85. The non-transitory computer-readable medium of claim 83, wherein the concatenated codeword comprises a concatenation of a first codeword and a second codeword, wherein the first codeword is different than the second codeword.

* * * * *